United States Patent
Koito et al.

(10) Patent No.: US 12,461,296 B2
(45) Date of Patent: Nov. 4, 2025

(54) OPTICAL LAMINATE AND IMAGE DISPLAY DEVICE

(71) Applicant: FUJIFILM Corporation, Tokyo (JP)

(72) Inventors: Naoki Koito, Kanagawa (JP); Michio Arai, Kanagawa (JP); Shun Inoue, Kanagawa (JP); Hiroshi Matsuyama, Kanagawa (JP); Yoshiaki Takada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 319 days.

(21) Appl. No.: 18/185,052

(22) Filed: Mar. 16, 2023

(65) Prior Publication Data
US 2023/0217789 A1 Jul. 6, 2023

Related U.S. Application Data

(63) Continuation of application No. PCT/JP2021/034760, filed on Sep. 22, 2021.

(30) Foreign Application Priority Data

Sep. 30, 2020 (JP) ................. 2020-165078

(51) Int. Cl.
*G02B 5/30* (2006.01)
*H10K 59/80* (2023.01)

(52) U.S. Cl.
CPC ......... *G02B 5/3016* (2013.01); *H10K 59/873* (2023.02); *H10K 59/8791* (2023.02)

(58) Field of Classification Search
CPC ... G02B 5/00–5/32; H10K 59/00–59/95; C09J 7/38; C09J 7/385; C09J 133/00–133/26; C09J 2203/318
See application file for complete search history.

(56) References Cited

U.S. PATENT DOCUMENTS

| 2020/0109333 A1 | 4/2020 | Akutagawa et al. |
| 2020/0318011 A1 | 10/2020 | Shibata et al. |
| 2021/0347149 A1 | 11/2021 | Shibata et al. |

FOREIGN PATENT DOCUMENTS

| CN | 110799868 A | 2/2020 |
| JP | 2004-361712 A | 12/2004 |

(Continued)

OTHER PUBLICATIONS

Office Action, which was issued by the Japanese Patent Office on Apr. 9, 2024, in connection with Japanese Patent Application No. 2022-553861.

(Continued)

*Primary Examiner* — Prashant J Khatri
(74) *Attorney, Agent, or Firm* — Edwards Neils LLC; Jean C. Edwards, Esq.

(57) ABSTRACT

Provided is an optical laminate with excellent durability and an image display device formed of the optical laminate. The optical laminate includes a pressure sensitive adhesive layer 1, a specific laminate including a resin layer and a light absorption anisotropic layer which are adjacent to each other, and a pressure sensitive adhesive layer 2 in order, in which the light absorption anisotropic layer contains a dichroic substance, the pressure sensitive adhesive layer 1 is adjacent to the resin layer of the specific laminate, and a storage elastic modulus Ep of the pressure sensitive adhesive layer 1 and a storage elastic modulus Ea and a moist heat strain $\delta a$ of the resin layer satisfy Expression (1-1) $\frac{1}{4}(3 \times Ep/Ea)^{2/3} > \delta a$.

20 Claims, 1 Drawing Sheet

(56) References Cited

FOREIGN PATENT DOCUMENTS

| JP | 2008-281989 | A | | 11/2008 | | |
|----|-------------|---|---|---------|---|---|
| JP | 2017-095660 | A | | 6/2017 | | |
| JP | 2020-019277 | A | | 2/2020 | | |
| WO | 2019/131976 | A1 | | 7/2019 | | |
| WO | 2020/080359 | A1 | | 4/2020 | | |
| WO | 2020/149343 | A1 | | 7/2020 | | |
| WO | WO-2020195699 | A1 | * | 10/2020 | ............... | B32B 7/12 |

OTHER PUBLICATIONS

International Search Report issued in PCT/JP2021/034760 on Nov. 30, 2021.
Written Opinion issued in PCT/JP2021/034760 on Nov. 30, 2021.
International Preliminary Report on Patentability completed by WIPO on Mar. 28, 2023 in connection with International Patent Application No. PCT/JP2021/034760.
Office Action, which was issued by the State Intellectual Property Office of China on May 28, 2025, in connection with Chinese Patent Application No. 202180065541.0.
Office Action, which was issued by the State Intellectual Property Office of China on Aug. 1, 2025, in connection with Chinese Patent Application No. 202180065541.0.

* cited by examiner

OPTICAL LAMINATE AND IMAGE DISPLAY DEVICE

CROSS-REFERENCE TO RELATED APPLICATIONS

This application is a Continuation of PCT International Application No. PCT/JP2021/034760 filed on Sep. 22, 2021, which was published under PCT Article 21(2) in Japanese, and which claims priority under 35 U.S.C. § 119(a) to Japanese Patent Application No. 2020-165078 filed on Sep. 30, 2020. The above applications are hereby expressly incorporated by reference, in their entirety, into the present application.

BACKGROUND OF THE INVENTION

1. Field of the Invention

The present invention relates to an optical laminate and an image display device.

2. Description of the Related Art

Optical films such as optical compensation sheets and phase difference films are used in various image display devices from the viewpoints of eliminating image coloration and expanding a viewing angle.

A stretched birefringence film has been used as an optical film. However, in recent years, it has been suggested to use an optically anisotropic layer formed of a liquid crystal compound in place of the stretched birefringence film.

Such an optically anisotropic layer is known to be provided with an alignment film on a support that forms an optically anisotropic layer to align a liquid crystal compound, and a photo-alignment film subjected to a photo-alignment treatment in place of a rubbing treatment is known as the alignment film.

For example, WO2020/080359A describes an optical laminate including a support, an alignment layer, a light absorption anisotropic layer, and a pressure sensitive adhesive layer in this order, in which the alignment layer is a photo-alignment layer formed of a composition for forming an alignment layer containing a cinnamoyl compound that contains a functional group having an ethylenically unsaturated double bond ([Claim 1]).

SUMMARY OF THE INVENTION

The present inventors found that as a result of preparation of an optical laminate having a layer configuration formed by sandwiching the laminate including the photo-alignment layer and the light absorption anisotropic layer described in WO2020/080359A between two pressure sensitive adhesive layers from the viewpoint of bonding the optical laminate to an image display element or the like, unevenness may occur in the reflection on the surface of the optical laminate depending on the kind of the photo-alignment film in a case where the optical laminate is exposed to a high-temperature and a high-humidity environment. That is, it was found that the durability against a high-temperature and high-humidity environment (hereinafter, "durability against a high-temperature and high-humidity environment" is also simply referred to as "durability") may be insufficient.

Further, the present inventors found that the same phenomenon as described above occurs even in a case where the photo-alignment layer is changed to a different resin layer in the optical laminate.

Therefore, an object of the present invention is to provide an optical laminate with excellent durability and an image display device formed of the optical laminate.

As a result of intensive examination conducted to achieve the above-described object, the present inventors focused on one of two pressure sensitive adhesive layers of an optical laminate and a resin layer (for example, a photo-alignment layer) adjacent to the pressure sensitive adhesive layer and found that the above-described object can be achieved in a case where a storage elastic modulus Ep of the pressure sensitive adhesive layer and a storage elastic modulus Ea and a moist heat strain Sa of the resin layer satisfy a predetermined relationship, thereby completing the present invention.

That is, the present inventors found that the above-described object can be achieved by employing the following configurations.

[1] An optical laminate including in the following order: a pressure sensitive adhesive layer 1; a specific laminate including a resin layer and a light absorption anisotropic layer which are adjacent to each other; and a pressure sensitive adhesive layer 2, in which the light absorption anisotropic layer contains a dichroic substance, the pressure sensitive adhesive layer 1 is adjacent to the resin layer included in the specific laminate, and a storage elastic modulus Ep of the pressure sensitive adhesive layer 1 and a storage elastic modulus Ea and a moist heat strain δa of the resin layer satisfy Expression (1-1).

$$\tfrac{1}{4}(3 \times Ep/Ea)^{2/3} > \delta a \tag{1-1}$$

Here, both the storage elastic modulus Ep of the pressure sensitive adhesive layer 1 and the storage elastic modulus Ea of the resin layer are in units of GPa, and the moist heat strain Sa of the resin layer denotes a value defined by Equation (2).

$$\delta a = L_{max}/L_0 \times 100 \tag{2}$$

$L_{max}$: A maximum displacement amount (mm) in a case where a temperature profile in the following moist heat strain test is applied $L_0$: A distance between chucks (mm) in the following moist heat strain test Moist heat strain test: A single resin layer film having a film thickness of 10 μm is used as a specimen, the specimen is held in an environment of 25° C. and a relative humidity of 50% for 30 minutes in a state where the distance between chucks is set to 15 mm and an extension load of 0.02 mN is applied thereto, the temperature and the humidity of the specimen are increased to 60° C. and a relative humidity of 90% over 80 minutes, the specimen is held in the environment of 60° C. and a relative humidity of 90% for 120 minutes, and the temperature and the humidity are decreased to 25° C. and a relative humidity of 50% over 80 minutes.

[2] The optical laminate according to [1], in which the resin layer is an alignment layer.

[3] The optical laminate according to [2], in which the alignment layer is a photo-alignment layer.

[4] The optical laminate according to any one of [1] to [3], in which the storage elastic modulus Ep of the pressure sensitive adhesive layer 1 and the storage elastic modulus Ea and the moist heat strain δa of the resin layer satisfy Expression (1-2).

$$\tfrac{1}{4}(3 \times Ep/Ea)^{2/3} - \delta a \geq 0.15 \tag{1-2}$$

[5] The optical laminate according to any one of [1] to [4], in which the storage elastic modulus Ea of the resin layer is 1 GPa or greater and 10 GPa or less.

[6] The optical laminate according to any one of [1] to [5], in which the storage elastic modulus Ea of the resin layer is 1 GPa or greater and 5 GPa or less.

[7] The optical laminate according to any one of [1] to [6], in which the optical laminate has a thickness of 50 μm or less.

[8] The optical laminate according to any one of [1] to [7], in which the resin layer has a thickness of 2 μm or less.

[9] An image display device comprising: the optical laminate according to any one of [1] to [8]; and an image display element.

[10] The image display device according to [9], in which the image display device is an organic EL display device.

According to the present invention, it is possible to provide an optical laminate with excellent durability and an image display device formed of the optical laminate.

DESCRIPTION OF THE PREFERRED EMBODIMENTS

Figure 1:
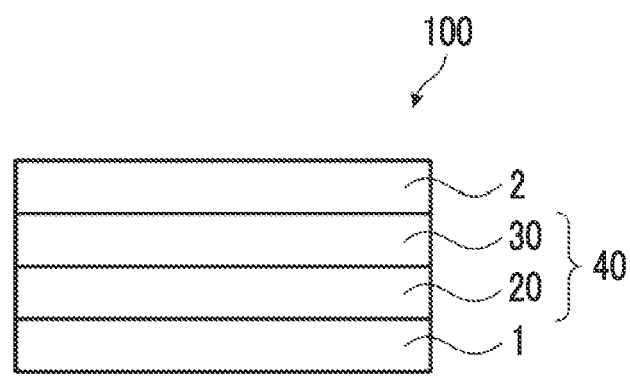
FIG. 1 is a schematic cross-sectional view showing an example of an optical laminate of the present invention.

Hereinafter, the present invention will be described in detail.

The description of constituent requirements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Further, in the present specification, the terms parallel, orthogonal, horizontal, and vertical do not indicate parallel, orthogonal, horizontal, and vertical in a strict sense, but indicate a range of parallel±10°, a range of orthogonal±10°, a range of horizontal±10°, and a range of vertical±100 respectively.

Further, in the present specification, substances corresponding to respective components may be used alone or in combination of two or more kinds thereof. Here, in a case where two or more kinds of substances corresponding to respective components are used in combination, the content of the components indicates the total content of the combined substances unless otherwise specified.

Further, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[I] Optical Laminate

An optical laminate according to the embodiment of the present invention (hereinafter, also referred to as "laminate according to the embodiment of the present invention") is an optical laminate including a pressure sensitive adhesive layer 1, a specific laminate including a resin layer and a light absorption anisotropic layer which are adjacent to each other, and a pressure sensitive adhesive layer 2 in the following order, in which the light absorption anisotropic layer contains a dichroic substance, the pressure sensitive adhesive layer 1 is adjacent to the resin layer of the specific laminate, and a storage elastic modulus Ep of the pressure sensitive adhesive layer 1 and a storage elastic modulus Ea and a moist heat strain δa of the resin layer satisfy Expression (1-1).

Here, the state in which the layers are adjacent to each other denotes a state in which the layers are in direct contact with each other.

The present inventors found that in a case where an optical laminate having a layer configuration formed by sandwiching a specific laminate including a resin layer and a light absorption anisotropic layer which are adjacent to each other between two pressure sensitive adhesive layers is exposed to a high-temperature and high-humidity environment, the resin layer is deformed into wrinkles and reflection unevenness occurs due to the deformation.

Therefore, in the optical laminate according to the embodiment of the present invention, it is considered that the resin layer is unlikely to be deformed even in a case of being exposed to a high-temperature and high-humidity environment or wrinkles are not formed even in a case where the resin layer is deformed because the storage elastic modulus Ep of one pressure sensitive adhesive layer and the storage elastic modulus Ea and the moist heat strain δa of the resin layer adjacent to the pressure sensitive adhesive layer have a specific relationship.

First, the laminate according to the embodiment of the present invention will be described with reference to the accompanying drawings.

FIG. 1 is a schematic cross-sectional view showing an example of the laminate according to the embodiment of the present invention.

An optical laminate 100 shown in FIG. 1 includes the pressure sensitive adhesive layer 1, a specific laminate 40 including a resin layer 20 and a light absorption anisotropic layer 30 which are adjacent to each other, and the pressure sensitive adhesive layer 2 in order.

The light absorption anisotropic layer 30 contains a dichroic substance.

The pressure sensitive adhesive layer 1 is adjacent to the resin layer 20 of the specific laminate 40.

The storage elastic modulus Ep of the pressure sensitive adhesive layer 1 and the storage elastic modulus Ea and the moist heat strain δa of the resin layer 20 satisfy Formula (1-1) described below.

Figure 2:
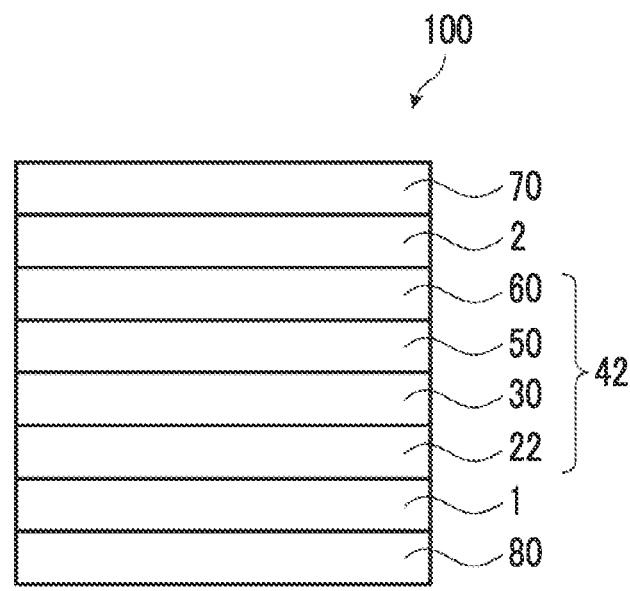
FIG. 2 is a schematic cross-sectional view showing an example of an optical laminate of the present invention.

FIG. 2 is a schematic cross-sectional view showing another example of a laminate of the present invention.

An optical laminate 200 shown in FIG. 2 includes a λ/4 plate 80, the pressure sensitive adhesive layer 1, a specific laminate 42 including a photo-alignment layer 22 and a light absorption anisotropic layer 30 which are adjacent to each other, the pressure sensitive adhesive layer 2, and a surface protective layer 70 in order.

The specific laminate 42 includes a cured layer 50 on the surface of the light absorption anisotropic layer 30 on the side opposite to the photo-alignment layer 22, and an oxygen blocking layer 60 on the surface of the cured layer 50 on the side opposite to the light absorption anisotropic layer 30.

The light absorption anisotropic layer 30 contains a dichroic substance.

The pressure sensitive adhesive layer 1 is adjacent to the photo-alignment layer 22 of the specific laminate 42.

Further, the optical laminate 200 includes a surface protective layer 70 on the surface of the pressure sensitive adhesive layer 2 on the side opposite to the oxygen blocking layer 60.

Further, the optical laminate 200 includes a λ/4 plate 80 on the surface of the pressure sensitive adhesive layer 1 on the side opposite to the photo-alignment layer 22.

The storage elastic modulus Ep of the pressure sensitive adhesive layer 1 and the storage elastic modulus Ea and the moist heat strain δa of the photo-alignment layer 22 satisfy Expression (1-1).

In the laminate according to the embodiment of the present invention, the storage elastic modulus Ep of the pressure sensitive adhesive layer 1 and the storage elastic modulus Ea and the moist heat strain δa of the photo-alignment layer 22 satisfy Expression (1-1).

$$¼(3×Ep/Ea)^{2/3} > δa \quad (1\text{-}1)$$

Here, both the storage elastic modulus Ep of the pressure sensitive adhesive layer 1 and the storage elastic modulus Ea of the resin layer are in units of GPa.

Further, the storage elastic modulus Ep and the storage elastic modulus Ea are measured by a nanoindentation method.

The storage elastic modulus can be measured by the nanoindentation method, for example, using a nanoindenter (trade name, "Triboindenter TI-950", manufactured by Hysitron, Inc.). The measurement is performed by setting the measurement mode as a single indentation measurement mode, a measurement temperature to 25° C., an indentation load of the indenter on the object to be measured to 20 μN, the indentation speed of the indenter to 2 μm/sec, and the withdrawal speed of the indenter from the object to be measured to 2 μm/sec after creeping at 20 μN for 5 seconds using a cube corner indenter as an indenter to be used. The derivation of the storage elastic modulus based on the nanoindentation method is performed by an Oliver-Pharr method, and is performed by a device used. The specific derivation method is as described in, for example, Handbook of Micro/nano Tribology (Second Edition) edited by Bharat Bhushan, CRCPress (ISBN0-8493-8402-8).

In addition, the storage elastic modulus may be measured by the nanoindentation method from a target surface of the film or in a cross-sectional direction of the film. In a case where the storage elastic modulus is measured in the cross-sectional direction, reliable data can be obtained because the film thickness is 50 times or greater the indentation depth.

Meanwhile, the moist heat strain δa of the resin layer denotes a value defined by Equation (2) and can be measured by thermomechanical analysis (TMA). As a thermomechanical analyzer, for example, "TMA4000SE and temperature/humidity generation unit HC9700" (trade name, manufactured by Netzsch) can be used.

$$δa = L_{max}/L_0 × 100 \quad (2)$$

$L_{max}$: A maximum displacement amount (mm) in a case where a temperature profile in the following moist heat strain test is applied $L_0$: A distance between chucks in the following moist heat strain test Moist heat strain test: A single resin layer film having a film thickness of 10 μm is used as a specimen, the specimen is held in an environment of 25° C. and a relative humidity of 50% for 30 minutes in a state where the distance between chucks is set to 15 mm and an extension load of 0.02 mN is applied thereto, the temperature and the humidity of the specimen are increased to 60° C. and a relative humidity of 90% over 80 minutes, the specimen is held in the environment of 60° C. and a relative humidity of 90% for 120 minutes, and the temperature and the humidity are decreased to 25° C. and a relative humidity of 50% over 80 minutes.

In the present invention, from the viewpoint that the durability of the optical laminate is further improved (hereinafter, also referred to as "from the viewpoint that the effects of the present invention are more excellent"), it is preferable that the storage elastic modulus Ep of the pressure sensitive adhesive layer 1 and the storage elastic modulus Ea and the moist heat strain δa of the resin layer satisfy Expression (1-2).

$$¼(3×Ep/Ea)^{2/3} - δa ≥ 0.15 \quad (1\text{-}2)$$

From the viewpoint of excellent flexibility, the thickness of the laminate according to the embodiment of the present invention is preferably 100 μm or less and more preferably 50 μm or less.

Further, the thickness of the laminate according to the embodiment of the present invention is preferably 1 μm or greater and more preferably 10 μm or greater.

Hereinafter, each layer of the laminate according to the embodiment of the present invention will be described.

[1] Pressure Sensitive Adhesive Layer 1 and Pressure Sensitive Adhesive Layer 2

As described above, the laminate according to the embodiment of the present invention includes the pressure sensitive adhesive layer 1 and the pressure sensitive adhesive layer 2.

Examples of the pressure sensitive adhesive contained in the pressure sensitive adhesive layer 1 and the pressure sensitive adhesive layer 2 include a rubber-based pressure sensitive adhesive, an acrylic pressure sensitive adhesive, a silicone-based pressure sensitive adhesive, a urethane-based pressure sensitive adhesive, a vinyl alkyl ether-based pressure sensitive adhesive, a polyvinyl alcohol-based pressure sensitive adhesive, a polyvinylpyrrolidone-based pressure sensitive adhesive, a polyacrylamide-based pressure sensitive adhesive, and a cellulose-based pressure sensitive adhesive.

Among these, an acrylic pressure sensitive adhesive (pressure sensitive adhesive) is preferable from the viewpoints of the transparency, the weather fastness, the heat resistance, and the like.

The pressure sensitive adhesive layer 1 and the pressure sensitive adhesive layer 2 can be formed by, for example, a method of coating a release sheet with a solution of a pressure sensitive adhesive, drying the solution, and transferring the sheet to a surface of a transparent resin layer or a method of directly coating a surface of a transparent resin layer with a solution of a pressure sensitive adhesive and drying the solution.

A solution of a pressure sensitive adhesive is prepared as a 10% to 40% by mass solution obtained by dissolving or dispersing the pressure sensitive adhesive in a solvent such as toluene or ethyl acetate.

As a coating method, a roll coating method such as reverse coating or gravure coating, a spin coating method, a screen coating method, a fountain coating method, a dipping method, or a spraying method can be employed.

Examples of the constituent material of the release sheet include appropriate thin paper bodies, for example, synthetic resin films such as polyethylene, polypropylene, and polyethylene terephthalate, rubber sheets, paper, cloth, nonwoven fabrics, nets, foam sheets, and metal foils.

[Thickness of Pressure Sensitive Adhesive Layer]

The thicknesses of the pressure sensitive adhesive layer 1 and the pressure sensitive adhesive layer 2 are not particularly limited, but are preferably in a range of 3 μm to 50 μm, more preferably in a range of 4 μm to 40 μm, and still more preferably in a range of 5 μm to 30 μm from the viewpoint that the effects of the present invention are more excellent.

From the viewpoint that the effects of the present invention are more excellent, it is preferable that the thickness of at least one of the pressure sensitive adhesive layer 1 or the pressure sensitive adhesive layer 2 is greater than the thickness of the specific laminate described below and more preferable that both the pressure sensitive adhesive layer 1 and the pressure sensitive adhesive layer 2 are greater than the thickness of the specific laminate described below.

[2] Specific Laminate

As described above, the laminate according to the embodiment of the present invention includes a specific laminate including a resin layer and a light absorption anisotropic layer which are adjacent to each other. Further, the specific laminate may include a layer other than the resin layer and the light absorption anisotropic layer.

Here, the pressure sensitive adhesive layer 1 described above is a pressure sensitive adhesive layer adjacent to the resin layer of the specific laminate as described above.

Further, it is preferable that the pressure sensitive adhesive layer 2 described above is adjacent to the light absorption anisotropic layer (in a case where the specific laminate includes a cured layer or an oxygen blocking layer described below, these layers) of the specific laminate. That is, it is preferable that the specific laminate is a laminate consisting of all layers that are present between the pressure sensitive adhesive layer 1 and the pressure sensitive adhesive layer 2.

Hereinafter, each layer of the specific laminate will be described.

[Resin Layer]

The resin layer of the specific laminate is not particularly limited, and various known resin layers can be used.

Examples of the resin layer include those described as examples of the cured layer below, such as a layer containing a liquid crystal compound, a layer obtained by curing a composition containing a polyfunctional monomer, and a layer obtained by curing a composition which contains a polymer containing a functional group.

In addition, other examples of the resin layer include a layer formed of a resin that is simply dried and solidified (hereinafter, also referred to as "resin binder") such that the resin layer itself is formed of only a resin that does not have polymerization reactivity. Examples of such a resin binder include an epoxy resin, a diallyl phthalate resin, a silicone resin, a phenol resin, an unsaturated polyester resin, a polyimide resin, a polyurethane resin, a melamine resin, a urea resin, an ionomer resin, an ethylene ethyl acrylate resin, an acrylonitrile acrylate styrene copolymer resin, an acrylonitrile styrene resin, an acrylonitrile polyethylene chloride styrene copolymer resin, an ethylene vinyl acetate resin, an ethylene vinyl alcohol copolymer resin, an acrylonitrile butadiene styrene copolymer resin, a vinyl chloride resin, a chlorinated polyethylene resin, a polyvinylidene chloride resin, a cellulose acetate resin, a fluororesin, a polyoxymethylene resin, a polyamide resin, a polyarylate resin, a thermoplastic polyurethane elastomer, a polyether ether ketone resin, a polyether sulfone resin, polyethylene, polypropylene, a polycarbonate resin, polystyrene, a polystyrene maleic acid copolymer resin, a polystyrene acrylic acid copolymer resin, a polyphenylene ether resin, a polyphenylene sulfide resin, a polybutadiene resin, a polybutylene terephthalate resin, an acrylic resin, a methacrylic resin, a methylpentene resin, polylactic acid, a polybutylene succinate resin, a butyral resin, a formal resin, polyvinyl alcohol, polyvinylpyrrolidone, ethyl cellulose, carboxymethyl cellulose, gelatin, and copolymer resins thereof.

The function of such a resin layer is not particularly limited, and for example, a layer having a function such as a stress relaxation layer, a protective layer, an alignment layer, a flattening layer, or a refractive index adjusting layer may be used.

[Alignment Layer]

From the viewpoint that the alignment of the light absorption anisotropic layer adjacent to the resin layer is not disturbed, it is preferable that the resin layer is an alignment layer.

Examples of the kind of the alignment layer include a photo-alignment layer and a rubbing treatment alignment layer. Among these, from the viewpoint that the effects of the present invention are more excellent, a photo-alignment layer is preferable.

<Photo-Alignment Layer>

The photo-alignment layer is a layer to which an alignment regulation force is applied by irradiation with light.

From the viewpoint that the effects of the obtained optical laminate according to the present invention are more excellent, it is preferable that the photo-alignment layer is an alignment layer to which an alignment regulation force is applied, which is obtained by performing a step (coating film forming step) of coating a polymer film with a composition (hereinafter, also referred to as "composition for forming a photo-alignment layer") that contains a compound (photoactive compound) containing a photoreactive group, a step (drying step) of heating the coating film so that the coating film is dried, and a step (light irradiation step) of irradiating the dried coating film with polarized light or non-polarized light in a direction oblique to the surface of the coating film.

Hereinafter, "the effects of the present invention from the optical laminate to be obtained are more excellent" is also simply referred to as "the effects of the present invention are more excellent".

<Coating Film Forming Step>

As described above, the coating film forming step is a step of coating a polymer film with the composition for forming a photo-alignment layer to form a coating film.

(Polymer Film)

The polymer film is not particularly limited, and a polymer film that is commonly used (for example, a polarizer protective film) can be used.

Specific examples of the polymer constituting the polymer film include a cellulose-based polymer, an acrylic polymer containing an acrylic acid ester polymer such as polymethyl methacrylate or a lactone ring-containing polymer, a thermoplastic norbornene-based polymer, a polycarbonate-based polymer, a polyester-based polymer such as polyethylene terephthalate or polyethylene naphthalate, a styrene-based polymer such as polystyrene or an acrylonitrile-styrene copolymer (AS resin), a polyolefin-based polymer such as polyethylene, polypropylene, or an ethylene-propylene copolymer, a vinyl chloride-based polymer, an amide-based polymer such as nylon or aromatic polyamide, an imide-based polymer, a sulfone-based polymer, a polyether sulfone-based polymer, a polyether ether ketone-based polymer, a polyphenylene sulfide-based polymer, a vinylidene chloride-based polymer, a vinyl alcohol-based polymer, a vinyl butyral-based polymer, an arylate-based polymer, a polyoxymethylene-based polymer, an epoxy-based polymer, and a polymer obtained by mixing such polymers.

Among these, a cellulose-based polymer represented by triacetyl cellulose (hereinafter, also referred to as "cellulose acylate") can be preferably used.

Further, from the viewpoint of workability and optical performance, an acrylic polymer is also preferably used.

Examples of the acrylic polymer include polymethyl methacrylate and the lactone ring-containing polymer and the like described in paragraphs [0017] to [0107] of JP2009-98605A.

In the present invention, a cellulose-based polymer or a polyester-based polymer can be preferably used in an aspect of using a polymer film that can be peeled off from the prepared optical laminate.

Further, in the present invention, it is preferable that the polymer film is transparent.

Here, the term "transparent" in the present invention indicates that the transmittance of visible light is 60% or greater, preferably 80% or greater, and particularly preferably 90% or greater.

The thickness of the polymer film is not particularly limited, but is preferably 40 μm or less from the viewpoint that the thickness of the optical laminate can be reduced. The lower limit is not particularly limited, but is typically 5 μm or greater.

(Photoactive Compound)

As described above, the composition for forming a photo-alignment layer contains a compound containing a photoreactive group (photoactive compound).

The photoreactive group denotes a group that produces a liquid crystal alignment ability by irradiating with light. Specifically, the photoreactive group causes the photoreaction that is the origin of the liquid crystal alignment ability such as alignment induction or isomerization reaction, dimerization reaction, photocrosslinking reaction, or photodegradation reaction of molecules (also referred to as photoactive compounds) generated by irradiation with light.

As the photoreactive group, from the viewpoint that the effects of the present invention are more excellent, those having an unsaturated bond and particularly a double bond are preferable, and examples thereof include a group containing at least one selected from the group consisting of a carbon-carbon double bond (C═C bond), a carbon-nitrogen double bond (C═N bond), a nitrogen-nitrogen double bond (N═N bond), and carbon-oxygen double bond (C═O bond).

Examples of the photoreactive group having a C═C bond include a vinyl group, a polyene group, a stilbene group, a stilbazole group, a stilbazolium group, a chalcone group, and a cinnamoyl group.

Examples of the photoreactive group having a C═N bond include groups having structures such as an aromatic Schiff base and an aromatic hydrazone.

Examples of the photoreactive group having a C═O bond include a benzophenone group, a coumarin group, an anthraquinone group, and a maleimide group.

Examples of the photoreactive group having an N═N bond (hereinafter, also referred to as an "azo group") include an azobenzene group, an azonaphthalene group, an aromatic heterocyclic azo group, a bisazo group, a formazan group, and a group having azoxybenzene as a basic structure.

These groups may have a substituent such as an alkyl group, an alkoxy group, an aryl group, an allyloxy group, a cyano group, an alkoxycarbonyl group, a hydroxyl group, a sulfonic acid group, and a halogenated alkyl group.

Among these groups, a cinnamoyl group or an azobenzene group is preferable from the viewpoint that the polarized light irradiation amount required for photo-alignment is relatively small, and a photo-alignment layer having excellent thermal stability and temporal stability is easily obtained.

(1) Preferred Embodiment 1: Photoactive Compound Containing Azobenzene Group

As the photoactive compound containing an azobenzene group, a photoactive compound represented by Formula (I) is particularly preferable.

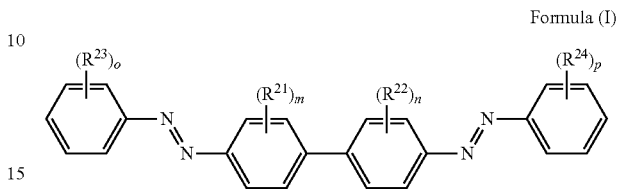

Formula (I)

In the formula, $R^{21}$ to $R^{24}$ each independently represent a hydrogen atom or a substituent, where at least one of the groups represented by $R^{21}$ to $R^{24}$ is a carboxyl group or a sulfo group, m represents an integer of 1 to 4, n represents an integer of 1 to 4, o represents an integer of 1 to 5, p represents an integer of 1 to 5, and a plurality of $R^{21}$'s to $R^{24}$'s may be the same as or different from each other in a case where m, n, o, and p represent an integer of 2 or greater.

In Formula (I), examples of the substituent represented by $R^{21}$ to $R^{24}$ include the following groups.

Examples of the substituent include a carboxyl group (which may form a salt with an alkali metal, and a carboxyl group that does not form a salt or a carboxyl group that forms a sodium salt is preferable, and a carboxyl group that forms a sodium salt is more preferable), a sulfo group (which may form a salt with an alkali metal, and a sulfo group that does not form a salt or a sulfo group that forms a sodium salt is preferable, and a sulfo group that forms a sodium salt is more preferable), an alkyl group (having preferably 1 to 20 carbon atoms, more preferably 1 to 12 carbon atoms, and particularly preferably 1 to 8 carbon atoms, and examples thereof include a methyl group, an ethyl group, an isopropyl group, a tert-butyl group, an n-octyl group, an n-decyl group, an n-hexadecyl group, a cyclopropyl group, a cyclopentyl group, and cyclohexyl group), alkenyl group (having preferably 2 to 20 carbon atoms, more preferably 2 to 12 carbon atoms, and particularly preferably 2 to 8 carbon atoms, and examples thereof include a vinyl group, an aryl group, a 2-butenyl group, and a 3-pentenyl group), an alkynyl group (having preferably 2 to 20 carbon atoms, more preferably 2 to 12 carbon atoms, and particularly preferably 2 to 8 carbon atoms, and examples thereof include a propargyl group and a 3-pentynyl group), an aryl group (having preferably 6 to 30 carbon atoms, more preferably 6 to 20 carbon atoms, and particularly preferably 6 to 12 carbon atoms, and examples thereof include a phenyl group, a 2,6-diethylphenyl group, a 3,5-ditrifluoromethylphenyl group, a naphthyl group, and a biphenyl group), and a substituted or unsubstituted amino group (having preferably 0 to 20 carbon atoms, more preferably 0 to 10 carbon atoms, and particularly preferably 0 to 6 carbon atoms, and examples thereof include an unsubstituted amino group, a methylamino group, a dimethylamino group, a diethylamino group, and an anilino group), an alkoxy group (having preferably 1 to 20 carbon atoms, more preferably 1 to 10 carbon atoms, and particularly preferably 1 to 6 carbon atoms, and examples thereof include a methoxy group, an ethoxy group, and a butoxy group), an alkoxycarbonyl group (having preferably 2 to 20 carbon atoms, more preferably 2 to 10 carbon atoms, and particularly preferably 2 to 6 carbon atoms, and examples thereof include a methoxycarbonyl group and an ethoxycarbonyl group), an acyloxy group (having preferably 2 to 20 carbon atoms, more preferably 2 to 10 carbon atoms, and particularly preferably 2 to 6 carbon atoms, and examples thereof include an acetoxy group and a benzoyloxy group), an acylamino group (having preferably 2 to 20 carbon atoms, more preferably 2 to 10 carbon atoms, and particularly preferably 2 to 6 carbon atoms, and examples thereof include an acetylamino group and a benzoylamino group), an alkoxycarbonylamino group (having preferably 2 to 20 carbon atoms, more preferably 2 to 10 carbon atoms, and particularly preferably 2 to 6 carbon atoms, and examples thereof include a methoxycarbonylamino group), an aryloxycarbonylamino group (having preferably 7 to 20 carbon atoms, more preferably 7 to 16 carbon atoms, and particularly preferably 7 to 12 carbon atoms, and examples thereof include a phenyloxycarbonylamino group), a sulfonylamino group (having preferably 1 to 20 carbon atoms, more preferably 1 to 10 carbon atoms, and particularly preferably 1 to 6 carbon atoms, and examples thereof include a methanesulfonylamino group and a benzenesulfonylamino group), a sulfamoyl group (having preferably 0 to 20, more preferably 0 to 10 carbon atoms, and particularly preferably 0 to 6 carbon atoms, and examples thereof include an unsubstituted sulfamoyl group, a methylsulfamoyl group, a dimethylsulfamoyl group, and a phenylsulfamoyl group), a carbamoyl group (having preferably 1 to 20 carbon atoms, more preferably 1 to 10 carbon atoms, and particularly preferably 1 to 6 carbon atoms, and examples thereof include an unsubstituted carbamoyl group, a methylcarbamoyl group, a diethylcarbamoyl group, and a phenylcarbamoyl group).

an alkylthio group (having preferably 1 to 20 carbon atoms, more preferably 1 to 10 carbon atoms, and particularly preferably 1 to 6 carbon atoms, and examples thereof include a methylthio group and an ethylthio group), an arylthio group (having preferably 6 to 20 carbon atoms, more preferably 6 to 16 carbon atoms, and particularly preferably 6 to 12 carbon atoms, and examples thereof include a phenylthio group), a sulfonyl group (having preferably 1 to 20 carbon atoms, more preferably 1 to 10 carbon atoms, and particularly preferably 1 to 6 carbon atoms, and examples thereof include a mesyl group and a tosyl group), a sulfinyl group (having preferably 1 to 20 carbon atoms, more preferably 1 to 10 carbon atoms, and particularly 1 to 6 carbon atoms, and examples thereof include a methanesulfinyl group and a benzenesulfinyl group), a ureido group (having preferably 1 to 20 carbon atoms, more preferably 1 to 10 carbon atoms, and particularly preferably 1 to 6 carbon atoms, and examples thereof include an unsubstituted ureido group, a methyl ureido group, and a phenyl ureido group), a phosphoric acid amide group (having preferably 1 to 20 carbon atoms, more preferably 1 to 10 carbon atoms, and particularly preferably 1 to 6 carbon atoms, and examples thereof include a diethyl phosphoric acid amide group and a phenyl phosphoric acid amide group), a hydroxy group, a mercapto group, a halogen atom (such as a fluorine atom, a chlorine atom, a bromine atom, or an iodine atom), a cyano group, a nitro group, a hydroxamic acid group, a sulfino group, a hydrazino group, an imino group, a heterocyclic group (having preferably 1 to 30 carbon atoms and more preferably 1 to 12 carbon atoms, and examples thereof include a heterocyclic group having heteroatoms such as nitrogen atoms, oxygen atoms, and sulfur atoms, and specific examples thereof include an imidazolyl group, a pyridyl group, a quinolyl group, a furyl group, a piperidyl group, a morpholino group, a benzoxazolyl group, a benzimidazolyl group, and a benzothiazolyl group), and a silyl group (having preferably 3 to 40 carbon atoms, more preferably 3 to 30 carbon atoms, and particularly preferably 3 to 24 carbon atoms, and examples thereof include a trimethylsilyl group and a triphenylsilyl group).

These substituents may be further substituted with these substituents. Further, in a case where two or more substituents are present, these may be the same as or different from each other. Further, these may be bonded to each other to form a ring where possible. The group represented by any of $R^{21}$ to $R^{24}$ may be a polymerizable group or a substituent containing a polymerizable group.

In Formula (I), as the group represented by any of $R^{21}$ to $R^{24}$, from the viewpoint that the effects of the present invention are more excellent, a hydrogen atom, a carboxyl group, a sulfo group, a halogen atom, an alkyl group, an alkoxy group, a cyano group, a nitro group, an alkoxycarbonyl group, or a carbamoyl group is preferable, a hydrogen atom, a carboxyl group, a sulfo group, a halogen atom, a halogenated methyl group, a halogenated methoxy group, a cyano group, a nitro group, or a methoxycarbonyl group is more preferable, and a hydrogen atom, a carboxyl group, a sulfo group, a halogen atom, a cyano group, or a nitro group is particularly preferable.

At least one of the groups represented by $R^{21}$ to $R^{24}$ is a carboxyl group or a sulfo group. The substitution position of the carboxyl group or the sulfo group is not particularly limited, but from the viewpoint of photoactivation, it is preferable that at least one $R^{21}$ and/or at least one $R^{22}$ represent a sulfo group and more preferable that at least one $R^{21}$ and at least one $R^{22}$ represent a sulfo group. From the same viewpoint as described above, it is preferable that at least one $R^{23}$ and/or at least one $R^{24}$ represent a carboxyl group and more preferable that at least one $R^{23}$ and at least one $R^{24}$ represent a carboxyl group. It is still more preferable that $R^{23}$ and $R^{24}$ substituted at the meta position with respect to an azo group represent a carboxyl group.

In Formula (I), m represents an integer of 1 to 4, n represents an integer of 1 to 4, o represents an integer of 1 to 5, and p represents an integer of 1 to 5. It is preferable that m represents an integer of 1 or 2, n represents an integer of 1 or 2, o represents an integer of 1 or 2, and p represents an integer of 1 or 2.

Hereinafter, specific examples of the compound represented by Formula (I) will be described below, but the present invention is not limited to the following specific examples.

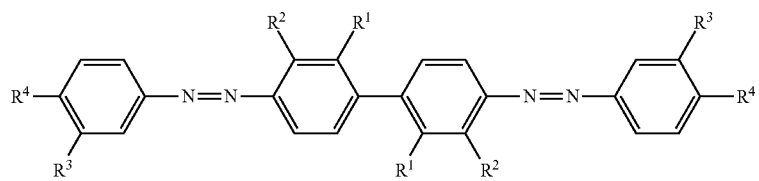

| No. | R¹ | R² | R³ | R⁴ |
|---|---|---|---|---|
| E-1 | —SO₃Na | —H | —COOH | —OH |
| E-2 | —H | —SO₃Na | —COOH | —OH |
| E-3 | —SO₃Na | —H | —COONa | —OH |
| E-4 | —H | —SO₃Na | —COONa | —OH |
| E-5 | —CH₃ | —H | —COONa | —OH |
| E-6 | —H | —CH₃ | —COONa | —OH |
| E-7 | —H | —OCH₃ | —COONa | —OH |
| E-8 | —H | —OCF₃ | —COONa | —OH |
| E-9 | —H | —Cl | —COONa | —OH |
| E-10 | —H | —CN | —COONa | —OH |
| E-11 | —H | —NO₂ | —COONa | —OH |
| E-12 | —COOCH₃ | —H | —COONa | —OH |
| E-13 | —CONH₂ | —H | —COONa | —OH |
| E-14 | —SO₂NH₂ | —H | —COONa | —OH |
| E-15 | —SO₃Na | —H | —COONa | —OH |
| E-16 | —SO₃Na | —H | —CH₂OH | —OH |
| E-17 | —H | —SO₃Na | —CH₂OH | —OH |
| E-18 | —SO₃Na | —H | —COOH | —O—C₆H₄—C(O)O(CH₂)₄OC(O)CH=CH₂ |
| E-19 | —H | —SO₃Na | —COOH | —O—C₆H₄—C(O)O(CH₂)₄OC(O)CH=CH₂ |
| E-20 | —CH₃ | —H | —COONa | —O—C₆H₄—C(O)O(CH₂)₄OC(O)CH=CH₂ |
| E-21 | —H | —CH₃ | —COONa | —O—C₆H₄—C(O)O(CH₂)₄OC(O)CH=CH₂ |
| E-22 | —SO₃Na | —H | —CF₃ | —O—C₆H₄—C(O)O(CH₂)₄OC(O)CH=CH₂ |
| E-23 | —H | —SO₃Na | —CF₃ | —O—C₆H₄—C(O)O(CH₂)₄OC(O)CH=CH₂ |
| E-24 | —SO₃Na | —H | —COOH | —O—C₆H₄—C(O)O(CH₂)₆OC(O)CH=CH₂ |
| E-25 | —CH₃ | —H | —COONa | —O—C₆H₄—C(O)O(CH₂)₆OC(O)CH=CH₂ |
| E-26 | —SO₃Na | —H | —CF₃ | —O—C₆H₄—C(O)O(CH₂)₆OC(O)CH=CH₂ |

In the present invention, from the viewpoint that the alignment degree is excellent, as the compound containing an azo group (particularly, an azobenzene group) having a nitrogen-nitrogen double bond (N=N bond), a low-molecular-weight compound represented by any of Formulae E-1 to E-17 and containing no polymerizable group having a molecular weight of 1000 or less is preferable.

(2) Preferred Embodiment 2: Photoactive Compound Containing Cinnamoyl Group

As the photoactive compound containing a cinnamoyl group, a polymer is preferable from the viewpoint that the influence of contact with the photo-alignment layer is small.

Further, a polymer containing a cinnamoyl group and a crosslinkable group is preferable from the viewpoint that the influence of contact with the photo-alignment layer is further reduced.

The crosslinkable group may be a group that is crosslinked by causing a crosslinking reaction, and examples thereof include a cationically polymerizable group such as an epoxy group, and a radically polymerizable group such as an acrylate or a methacrylate.

Further, in order to improve the adhesiveness, it is still more preferable that the coating film of the photo-alignment layer contains both a cationically polymerizable group and a radically polymerizable group from the viewpoint of being functionally separated and used.

Suitable examples of the polymer containing a cinnamoyl group and a crosslinkable group include a photo-alignment copolymer having a repeating unit A containing a cinnamoyl group represented by Formula (A) and a repeating unit B containing a crosslinkable group represented by Formula (B).

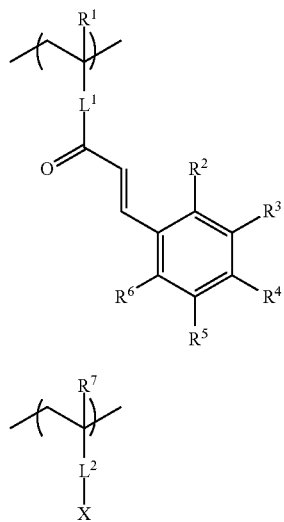

In Formula (A), $R^1$ represents a hydrogen atom or a methyl group. $L^1$ represents a divalent linking group having a nitrogen atom and a cycloalkane ring, and some carbon atoms constituting the cycloalkane ring may be substituted with heteroatoms selected from the group consisting of nitrogen, oxygen, and sulfur.

$R^2$, $R^3$, $R^4$, $R^5$, and $R^6$ each independently represent a hydrogen atom or a substituent, and two adjacent groups from among $R^2$, $R^3$, $R^4$, $R^5$, and $R^6$ may be bonded to each other to form a ring.

In Formula (B), $R^7$ represents a hydrogen atom or a methyl group, $L^2$ represents a divalent linking group, and X represents a crosslinkable group.

In the present invention, the solvent resistance of the photo-alignment layer to be obtained and the aligning properties of the polymer liquid crystal compound (hereinafter, referred to as "liquid crystal aligning properties") during formation of the light absorption anisotropic layer are enhanced by using a photo-alignment copolymer having a repeating unit A containing a cinnamoyl group represented by Formula (A) and a repeating unit B containing a crosslinkable group represented by Formula (B).

The reason for this is not clear, but the present inventors presume as follows.

That is, it is considered that in a case where the divalent linking group represented by $L^1$ in Formula (A) has a nitrogen atom and a cycloalkane ring, the hydrogen bond properties and the molecular rigidity are enhanced so that molecular motion is suppressed, and thus the solvent resistance is improved.

Similarly, it is considered that in a case where the divalent linking group represented by $L^1$ in Formula (A) has a nitrogen atom and a cycloalkane ring, the glass transition temperature of the copolymer is increased, the temporal stability of the photo-alignment layer to be obtained is improved, and thus the liquid crystal aligning properties are enhanced regardless of the timing of formation of the optically anisotropic layer.

Next, the divalent linking group having a nitrogen atom and a cycloalkane ring which is represented by $L^1$ in Formula (A) will be described. In the present invention, as described above, some carbon atoms constituting the cycloalkane ring may be substituted with a heteroatom selected from the group consisting of nitrogen, oxygen, and sulfur. Further, in a case where some carbon atoms constituting the cycloalkane ring are substituted with nitrogen atoms, the divalent linking group may not have a nitrogen atom separately from the cycloalkane ring.

Further, as the cycloalkane ring contained in the divalent linking group represented by $L^1$ in Formula (A), a cycloalkane ring having 6 or more carbon atoms is preferable, and specific examples thereof is a cyclohexane ring, a cycloheptane ring, a cyclooctane ring, a cyclododecane ring, and a cyclodocosane ring.

In the present invention, from the viewpoint of further enhancing the liquid crystal aligning properties, it is preferable that $L^1$ in Formula (A) represents a divalent linking group represented by any of Formulae (1) to (10).

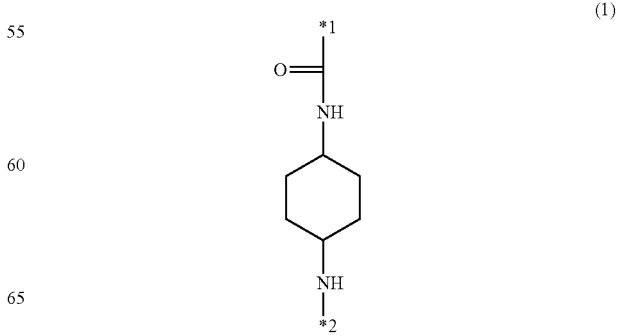

(2) 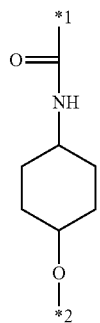

(3) 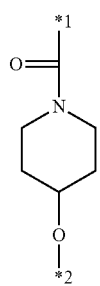

(4) 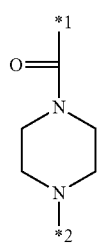

(5) 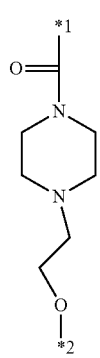

(6) 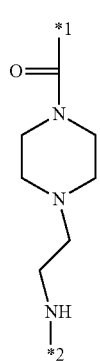

(7) 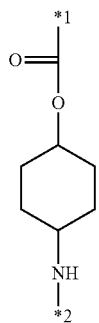

(8) 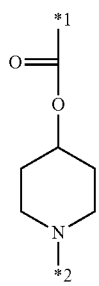

(9) 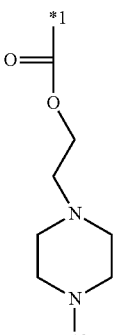

(10) 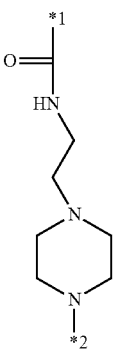

In Formulae (1) to (10), *1 represents a bonding position with respect to the carbon atom constituting the main chain in Formula (A), and *2 represents a bonding position with respect to the carbon atom constituting the carbonyl group in Formula (A).

Among the divalent linking groups represented by any of Formulae (1) to (10), from the viewpoint of enhancing the balance between the solubility in a solvent used for forming the photo-alignment layer and the solvent resistance of the photo-alignment layer to be obtained, a divalent linking group represented by any of Formulae (2), (3), (7), and (8) is preferable.

Next, the substituents represented by an aspect of $R^2$, $R^3$, $R^4$, $R^5$, and $R^6$ in Formula (A) will be described. Further, $R^2$, $R^3$, $R^4$, $R^5$, and $R^6$ in Formula (A) may represent a hydrogen atom in place of a substituent, as described above.

From the viewpoint that the cinnamoyl group easily interacts with the liquid crystal compound and the liquid crystal aligning properties are more satisfactory, it is preferable that the substituents represented by an aspect of $R^2$, $R^3$, $R^4$, $R^5$, and $R^6$ in Formula (A) are each independently a halogen atom, a linear, branched, or cyclic alkyl group having 1 to 20 carbon atoms, a linear halogenated alkyl group having 1 to 20 carbon atoms, an alkoxy group having 1 to 20 carbon atoms, an aryl group having 6 to 20 carbon atoms, an aryloxy group having 6 to 20 carbon atoms, a hydroxy group, a cyano group, an amino group, and a group represented by Formula (11). Further, the substituent may contain a linking group represented by $-(CH_2)_{na}-$ or $-O-(CH_2)_{na}-$. na represents an integer of 1 to 10.

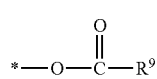

(11)

Here, in Formula (11), * represents a bonding position with respect to the benzene ring in Formula (A), and $R^9$ represents a monovalent organic group.

Examples of the halogen atom include a fluorine atom, a chlorine atom, a bromine atom, and an iodine atom. Among these, a fluorine atom and a chlorine atom are preferable.

In regard to the linear, branched, or cyclic alkyl group having 1 to 20 carbon atoms, an alkyl group having 1 to 6 carbon atoms is preferable as the linear alkyl group, and specific examples thereof include a methyl group, an ethyl group, and an n-propyl group.

An alkyl group having 3 to 6 carbon atoms is preferable as the branched alkyl group, and specific examples thereof include an isopropyl group and a tert-butyl group.

An alkyl group having 3 to 6 carbon atoms is preferable as the cyclic alkyl group, and specific examples thereof include a cyclopropyl group, a cyclopentyl group, and a cyclohexyl group.

As the linear halogenated alkyl group having 1 to 20 carbon atoms, a fluoroalkyl group having 1 to 4 carbon atoms is preferable, and specific examples thereof include a trifluoromethyl group, a perfluoroethyl group, a perfluoropropyl group, and a perfluorobutyl group. Among these, a trifluoromethyl group is preferable.

As the alkoxy group having 1 to 20 carbon atoms, an alkoxy group having 1 to 18 carbon atoms is preferable, an alkoxy group having 6 to 18 carbon atoms is more preferable, and an alkoxy group having 6 to 14 carbon atoms is still more preferable. Specific suitable examples thereof include a methoxy group, an ethoxy group, an n-butoxy group, a methoxyethoxy group, an n-hexyloxy group, an n-octyloxy group, an n-decyloxy group, an n-dodecyloxy group, and an n-tetradecyloxy group. Among these, an n-hexyloxy group, an n-octyloxy group, an n-decyloxy group, an n-dodecyloxy group, and an n-tetradecyloxy group are more preferable.

An aryl group having 6 to 20 carbon atoms is preferable as the aryl group having 6 to 12 carbon atoms, and specific examples thereof include a phenyl group, an α-methylphenyl group, and a naphthyl group. Among these, a phenyl group is preferable.

An aryloxy group having 6 to 12 carbon atoms is preferable as the aryloxy group having 6 to 20 carbon atoms, and specific examples thereof include a phenyloxy group and a 2-naphthyloxy group. Among these, a phenyloxy group is preferable.

Examples of the amino group include a primary amino group ($-NH_2$), a secondary amino group such as a methylamino group, and a tertiary amino group such as a dimethylamino group, a diethylamino group, a dibenzylamino group, or a group having a nitrogen atom of a nitrogen-containing heterocyclic compound (for example, pyrrolidine, piperidine, or piperazine) as a bonding site.

In regard to the group represented by Formula (11), examples of the monovalent organic group represented by $R^9$ in Formula (11) include an alkyl group having 1 to 20 carbon atoms, and suitable examples thereof include a linear alkyl group having 1 to 20 carbon atoms and a cyclic alkyl group having 3 to 20 carbon atoms.

As the linear alkyl group having 1 to 20 carbon atoms, an alkyl group having 1 to 6 carbon atoms is preferable, and specific examples thereof include a methyl group, an ethyl group, and an n-propyl group. Among these, a methyl group or an ethyl group is preferable.

As the cyclic alkyl group having 3 to 20 carbon atoms, an alkyl group having 3 to 6 carbon atoms is preferable, and specific examples thereof include a cyclopropyl group, a cyclopentyl group, and a cyclohexyl group.

Among these, a cyclohexyl group is preferable.

As the monovalent organic group represented by $R^9$ in Formula (11), a combination of a plurality of the linear alkyl groups and a plurality of the cyclic alkyl groups described above directly or via a single bond may be used.

In the present invention, it is preferable that at least $R^4$ among $R^2$, $R^3$, $R^4$, $R^5$, and $R^6$ in Formula (A) represents the above-described substituent from the viewpoint that the cinnamoyl group easily interacts with the liquid crystal compound and the liquid crystal aligning properties are further enhanced and more preferable that all $R^2$, $R^3$, $R^5$, and $R^6$ represent a hydrogen atom from the viewpoint that the linearity of the photo-alignment copolymer to be obtained is improved, the cinnamoyl group easily interacts with the liquid crystal compound, and the liquid crystal aligning properties are further enhanced.

In the present invention, from the viewpoint of improving the reaction efficiency in a case of irradiating the photo-alignment layer to be obtained with light, it is preferable that $R^4$ in Formula (A) represents an electron-donating substituent.

Here, the electron-donating substituent (electron-donating group) is a substituent having a Hammett's value (Hammett's substituent constant σp value) of 0 or less, and among the above-described substituents, an alkyl group, a halogenated alkyl group, and an alkoxy group are exemplified.

Among these, an alkoxy group is preferable, an alkoxy group having 6 to 16 carbon atoms is more preferable from the viewpoint that the liquid crystal aligning properties are further enhanced, and an alkoxy group having 7 to 10 carbon atoms is still more preferable.

Next, the divalent linking group represented by $L^2$ in Formula (B) will be described.

From the viewpoint that the cinnamoyl group easily interacts with the liquid crystal compound and the liquid crystal aligning properties are further enhanced, as the divalent linking group, a divalent linking group obtained by combining at least two or more groups selected from the group consisting of a linear, branched, or cyclic alkylene group having 1 to 18 carbon atoms which may have a substituent, an arylene group having 6 to 12 carbon atoms which may have a substituent, an ether group (—O—), a carbonyl group (—C(═O)—), and an imino group (—NH—) which may have a substituent is preferable.

Here, examples of the substituent that the alkylene group, the arylene group, and the imino group may have include a halogen atom, an alkyl group, an alkoxy group, an aryl group, an aryloxy group, a cyano group, a carboxy group, an alkoxycarbonyl group, and a hydroxyl group.

Examples of the halogen atom include a fluorine atom, a chlorine atom, a bromine atom, and an iodine atom. Among these, a fluorine atom and a chlorine atom are preferable.

As the alkyl group, for example, a linear, branched, or cyclic alkyl group having 1 to 18 carbon atoms is preferable, an alkyl group having 1 to 8 carbon atoms (such as a methyl group, an ethyl group, a propyl group, an isopropyl group, an n-butyl group, an isobutyl group, a sec-butyl group, a t-butyl group, or a cyclohexyl group) is more preferable, an alkyl group having 1 to 4 carbon atoms is still more preferable, and a methyl group or an ethyl group is particularly preferable.

As the alkoxy group, for example, an alkoxy group having 1 to 18 carbon atoms is preferable, an alkoxy group having 1 to 8 carbon atoms (such as a methoxy group, an ethoxy group, an n-butoxy group, or a methoxyethoxy group) is more preferable, an alkoxy group having 1 to 4 carbon atoms is still more preferable, and a methoxy group or an ethoxy group is particularly preferable.

Examples of the aryl group include an aryl group having 6 to 12 carbon atoms, and specific examples thereof include a phenyl group, an α-methylphenyl group, and a naphthyl group. Among these, a phenyl group is preferable.

Examples of the aryloxy group include phenoxy, naphthoxy, imidazolyloxy, benzimidazolyloxy, pyridine-4-yloxy, pyrimidinyloxy, quinazolinyloxy, purinyloxy, and thiophene-3-yloxy.

Examples of the alkoxycarbonyl group include methoxycarbonyl and ethoxycarbonyl.

In regard to the linear, branched, or cyclic alkylene group having 1 to 18 carbon atoms, specific examples of the linear alkylene group includes a methylene group, an ethylene group, a propylene group, a butylene group, a pentylene group, a hexylene group, a decylene group, an undecylene group, a dodecylene group, a tridecylene group, a tetradecylene group, a pentadecylene group, a hexadecylene group, a heptadecylene group, and an octadecylene group.

Further, specific examples of the branched alkylene group include a dimethylmethylene group, a methylethylene group, a 2,2-dimethylpropylene group, and a 2-ethyl-2-methylpropylene group.

Further, specific examples of the cyclic alkylene group include a cyclopropylene group, a cyclobutylene group, a cyclopentylene group, a cyclohexylene group, a cyclooctylene group, a cyclodecylene group, an adamantane-diyl group, a norbornane-diyl group, and an exo-tetrahydrodicyclopentadiene-diyl group. Among these, a cyclohexylene group is preferable.

Specific examples of the arylene group having 6 to 12 carbon atoms include a phenylene group, a xylylene group, a biphenylene group, a naphthylene group, and a 2,2'-methylenebisphenyl group. Among these, a phenylene group is preferable.

Next, the crosslinkable group represented by X in Formula (B) will be described.

Specific examples of X (crosslinkable group) in Formula (B) include an epoxy group, an epoxycyclohexyl group, an oxetanyl group, and a functional group having an ethylenically unsaturated double bond. Among these, at least one crosslinkable group selected from the group consisting of crosslinkable groups represented by Formulae (X1) to (X4) is preferable.

(X1)

(X2)

(X3)

(X4)

In Formulae (X1) to (X4), * represents a bonding position with respect to $L^2$ in Formula (B), and $R^8$ represents any of a hydrogen atom, a methyl group, or an ethyl group. In Formula (X4), S represents a functional group having an ethylenically unsaturated double bond.

Here, specific examples of the functional group having an ethylenically unsaturated double bond include a vinyl group, an allyl group, a styryl group, acryloyl group, and a methacryloyl group. Among these, an acryloyl group or a methacryloyl group is preferable.

In the present invention, from the viewpoint of increasing the strength of the optical laminate to be obtained and enhancing the handleability in a case of forming other layers using the optical laminate to be obtained, it is preferable that the repeating unit B includes a repeating unit in which X in Formula (B) represents a crosslinkable group represented by any one of Formulae (X1) to (X3) (hereinafter, also referred to as "repeating unit B1") and a repeating unit in which X in Formula (B) represents a crosslinkable group represented by Formula (X4) (hereinafter, also referred to as "repeating unit B2").

Specific examples of the repeating unit A containing a cinnamoyl group represented by Formula (A) include the following repeating units A-1 to A-44. In the following formulae, Me represents a methyl group, and Et represents an ethyl group. In the following specific examples, "1,4-cyclohexyl group" contained in the divalent linking group of each of the repeating units A-1 to A-10 may be any of a cis form or a transformer form and is preferably a transformer form.

A-1
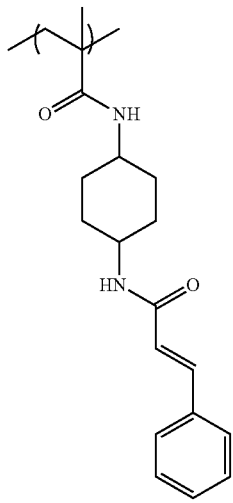
A-2
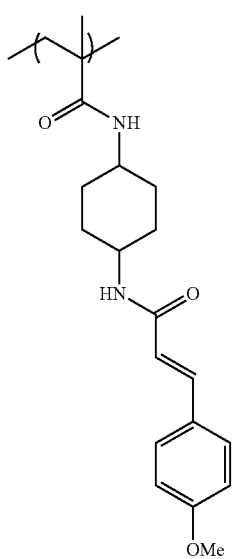
A-3
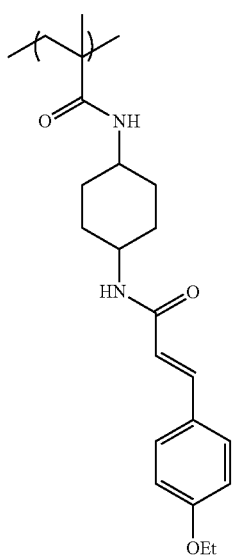
A-4
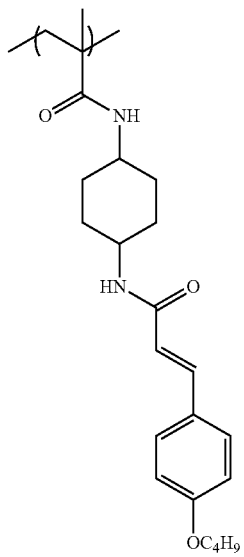
A-5
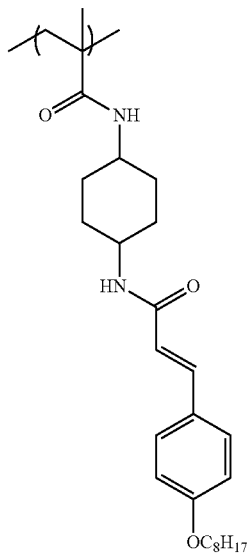
A-6
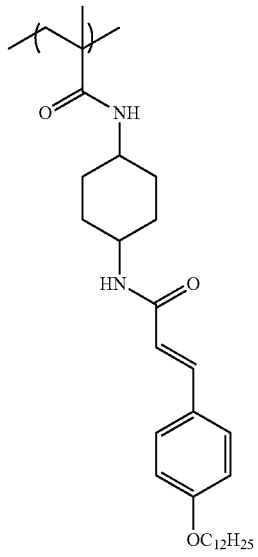

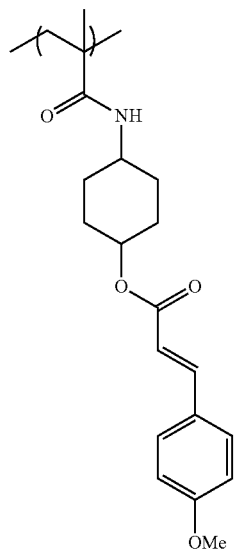
A-7
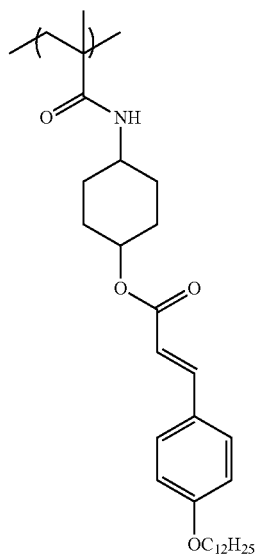
A-10
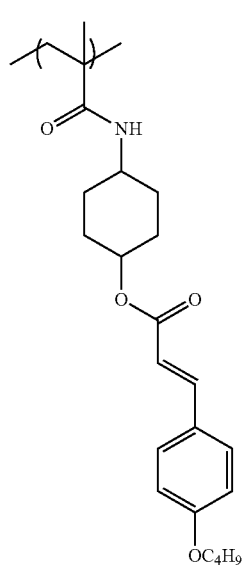
A-8
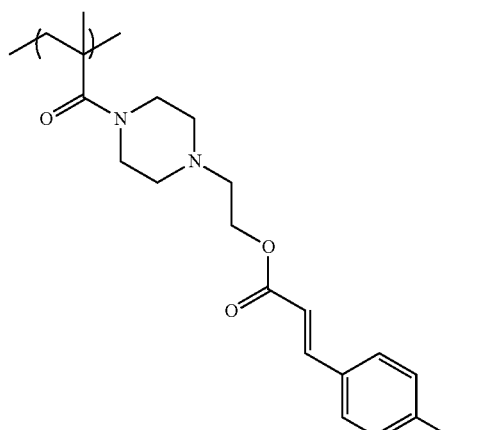
A-11
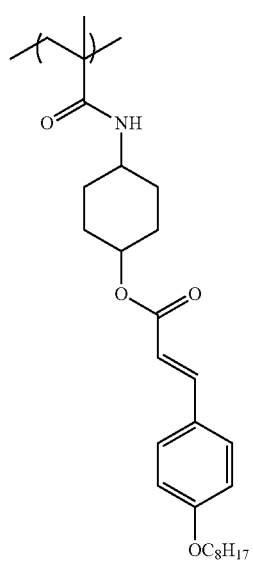
A-9
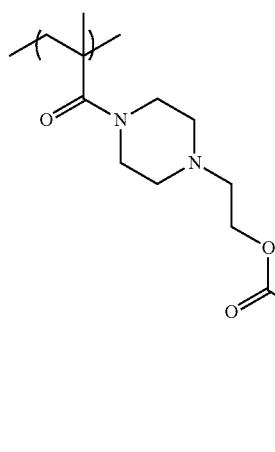
A-12

A-13
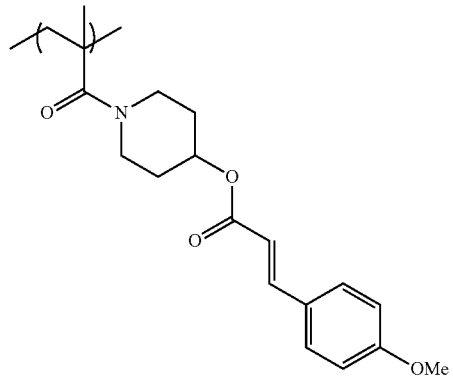
A-14
A-17
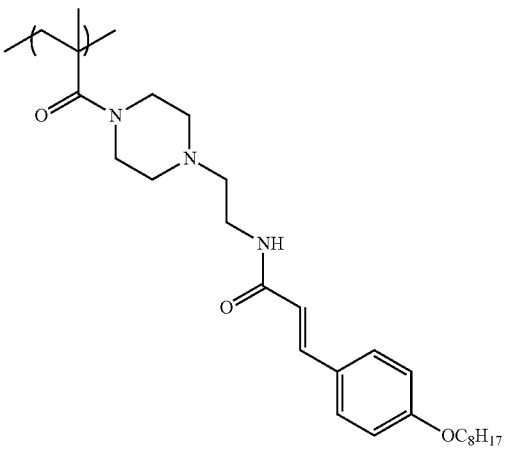
A-15
A-18
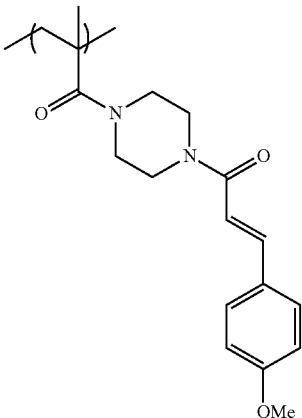
A-16
A-19
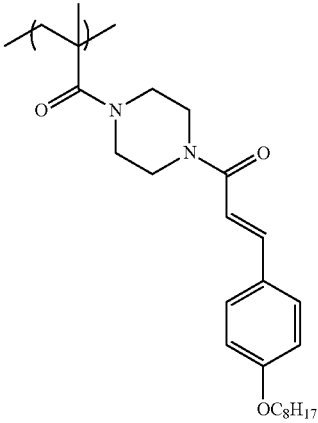

A-20
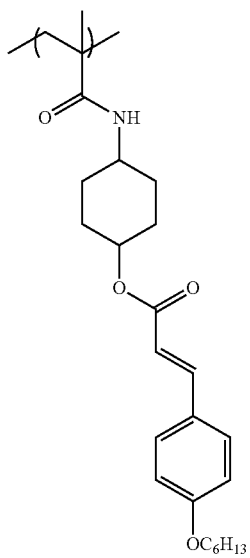
A-21
A-22
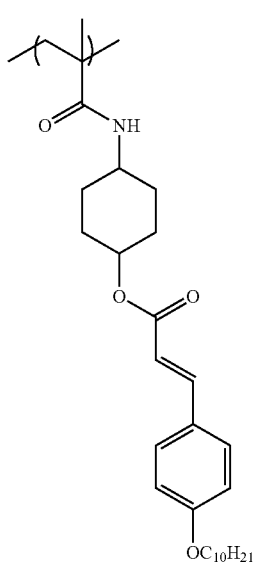
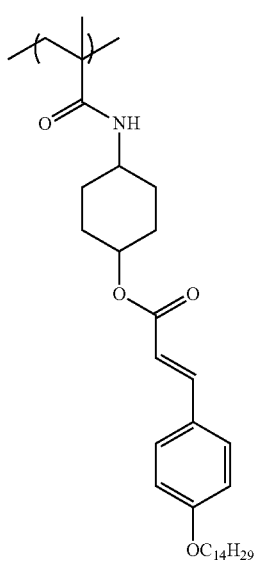
A-23
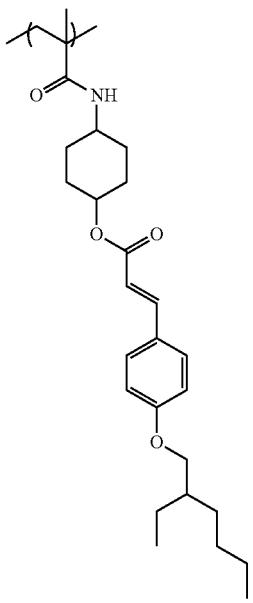
A-24

A-25
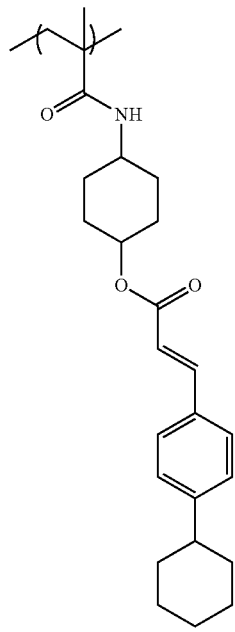
A-26
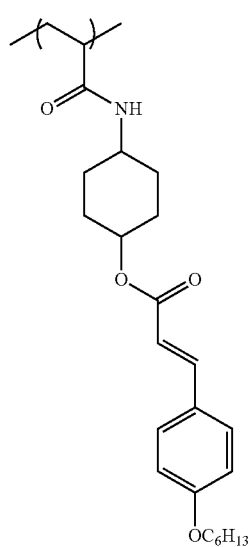
A-27
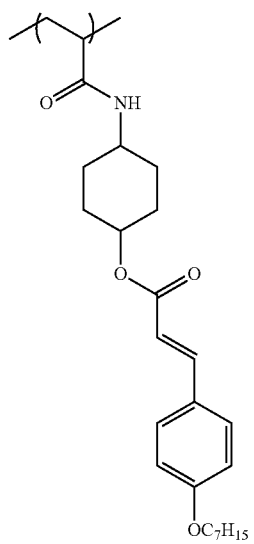
A-28
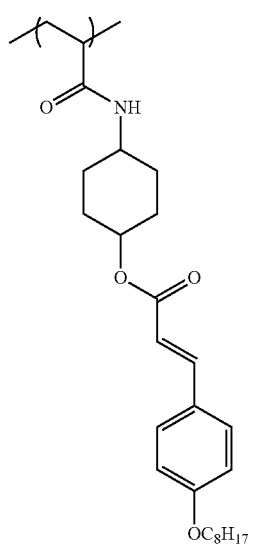

A-29
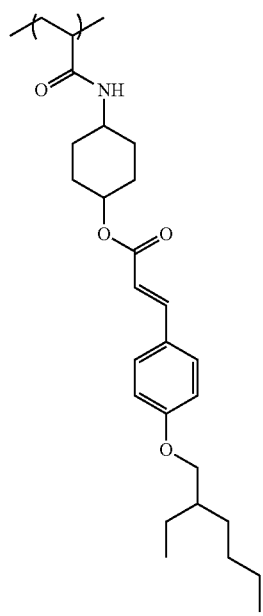
A-30
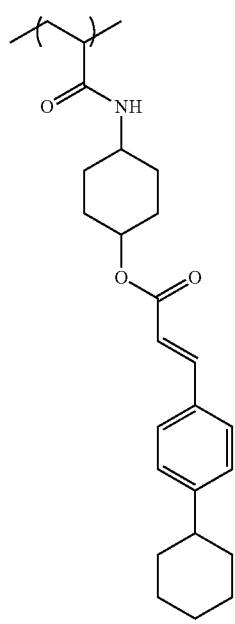
A-31
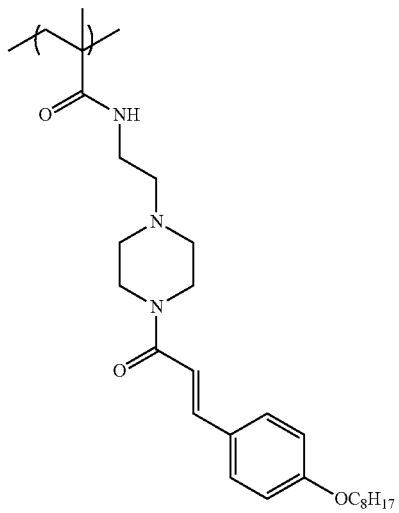
A-32
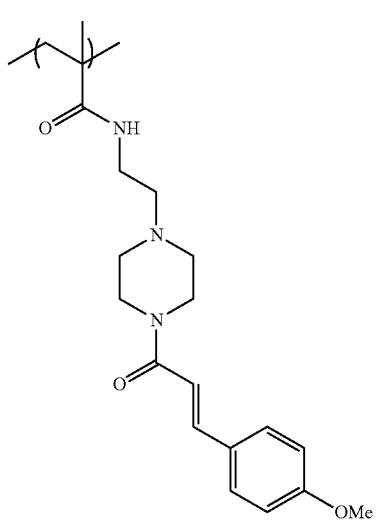
A-33
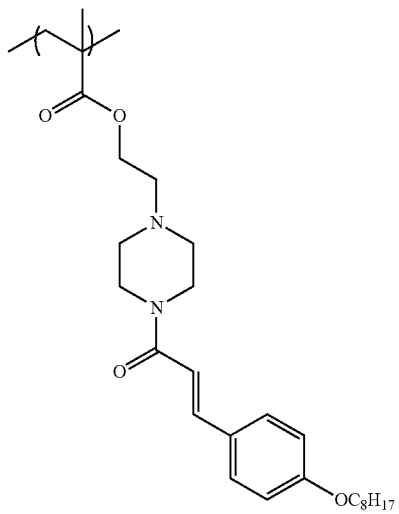

A-34
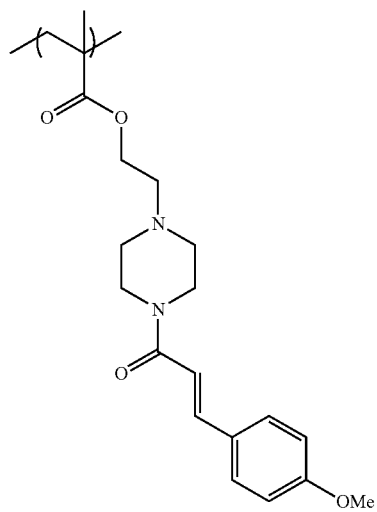
A-35
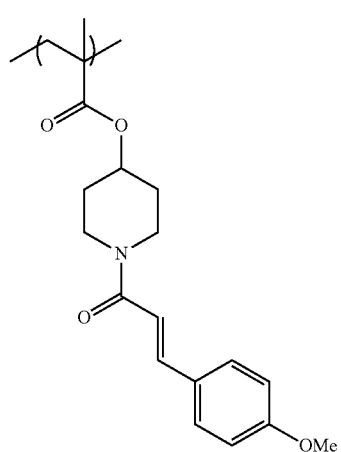
A-36
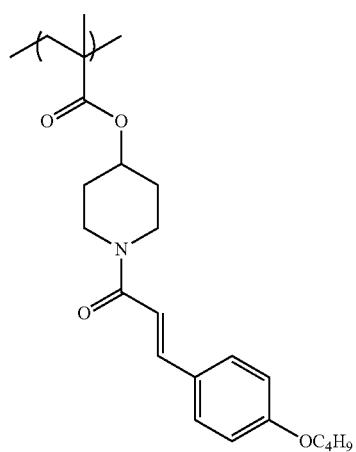
A-37
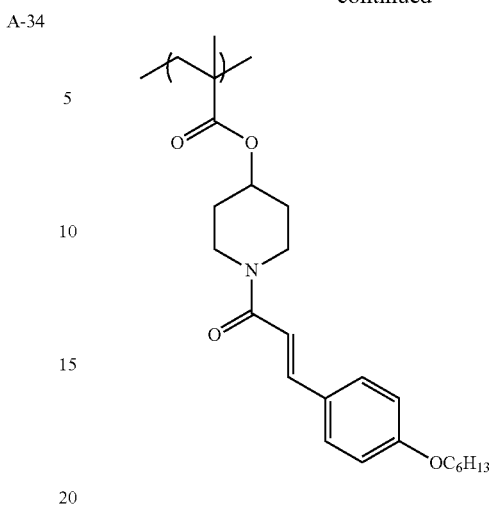
A-38
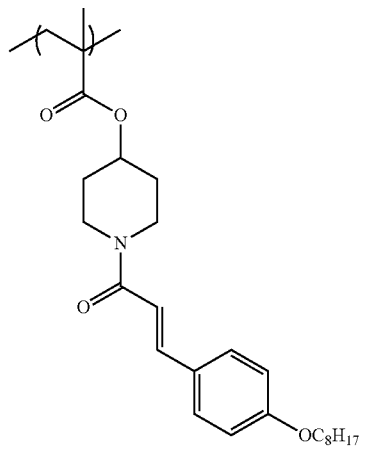
A-39
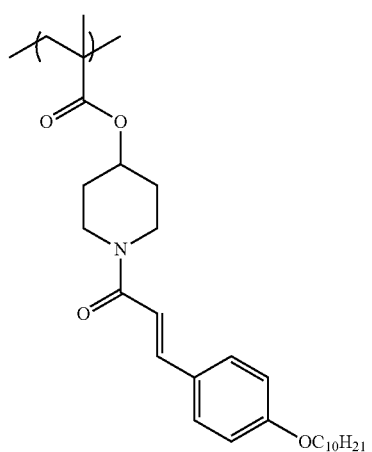

A-40
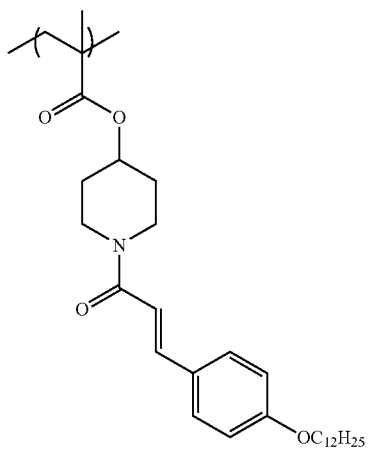
A-41
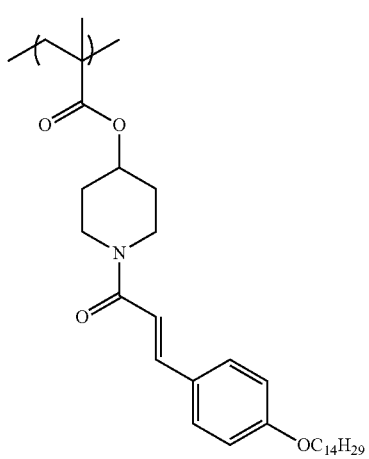
A-42
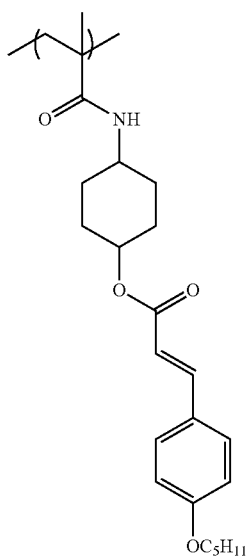
A-43
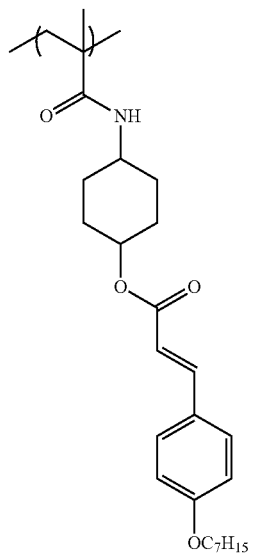
A-44
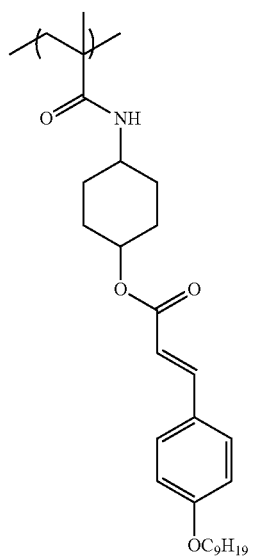
Specific examples of the repeating unit B (repeating unit B1) containing a crosslinkable group represented by Formula (B) include repeating units B-1 to B-17 shown below.
B-1
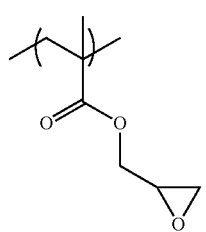

B-2
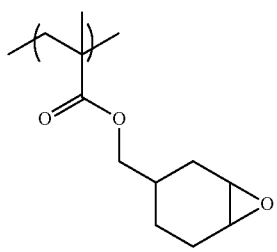
B-3
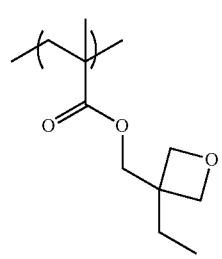
B-4
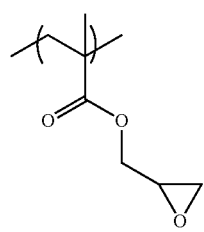
B-5
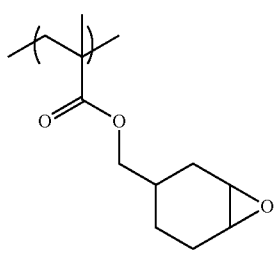
B-6
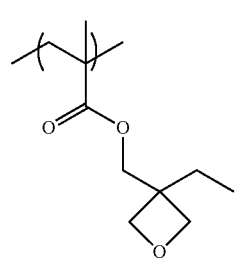
B-7
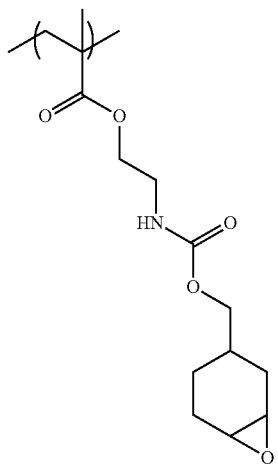
B-8
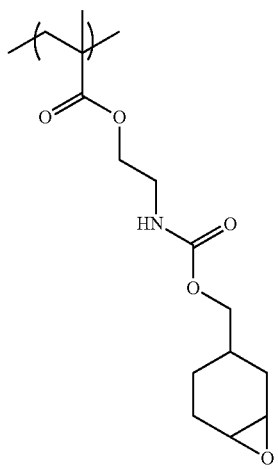
B-9
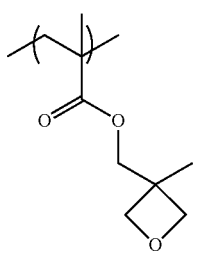
B-10
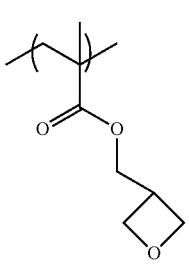

B-11
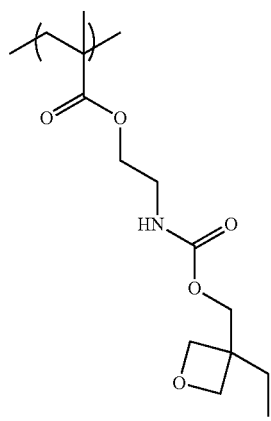
B-12
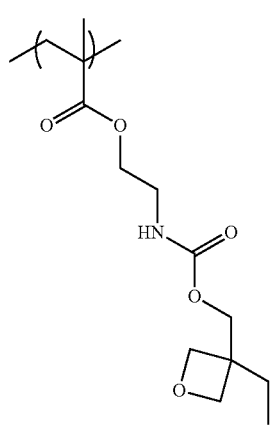
B-13
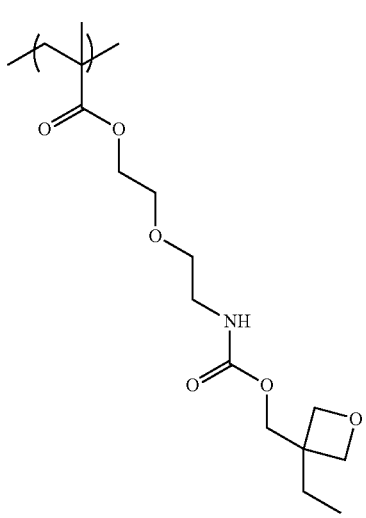
B-14
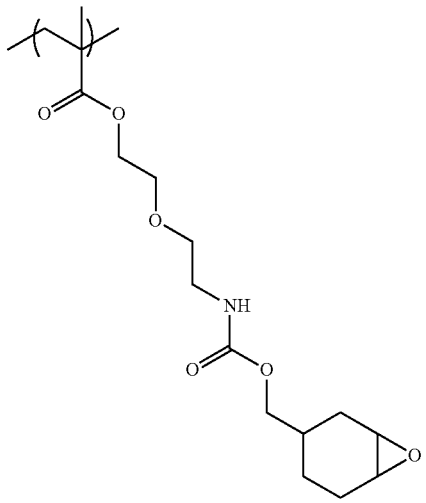
B-15
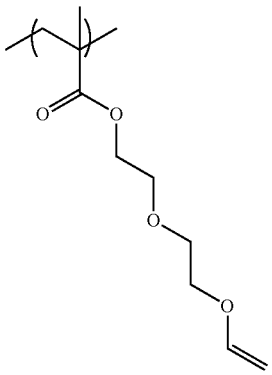
B-16
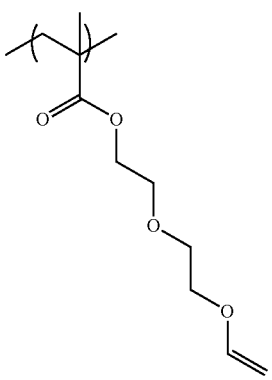

B-17
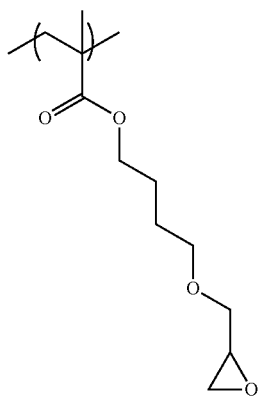
Further, specific examples of the repeating unit B (repeating unit B2) containing a crosslinkable group represented by Formula (B) include repeating units B-18 to B-47 shown below.
B-18
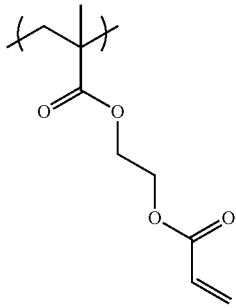
B-19
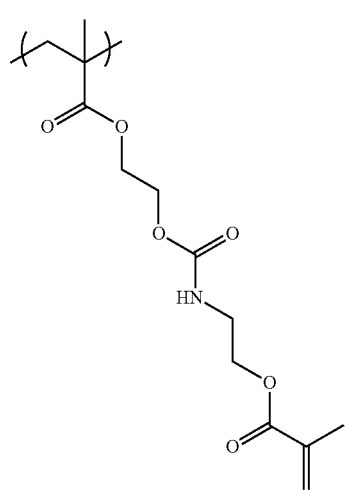
B-20
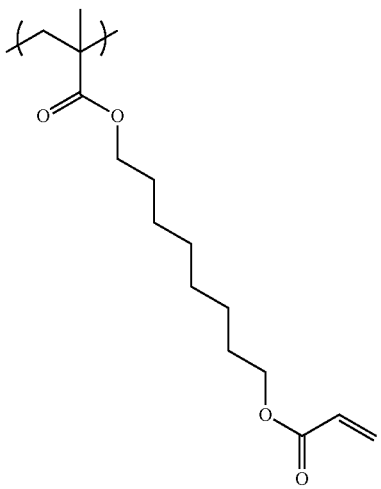
B-21
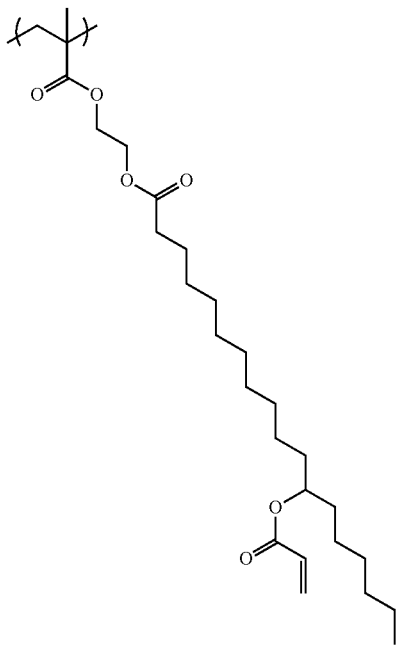
B-22
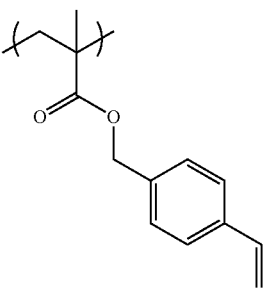

-continued
B-23
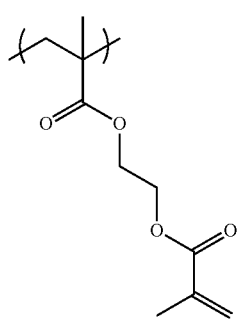
B-24
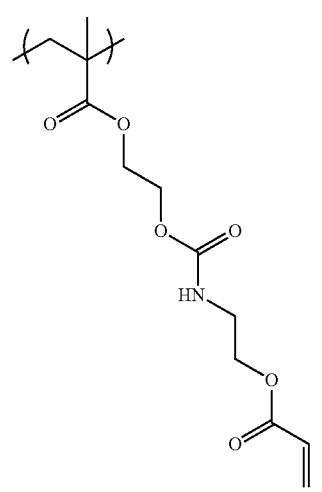
B-25
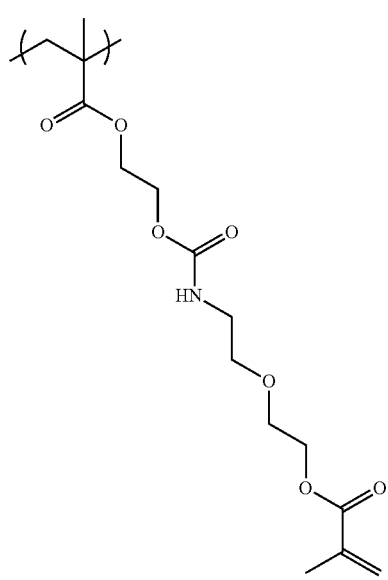
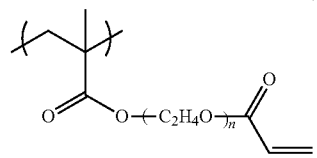
B-26: n = 2
B-27: n = 4.5
B-28: n = 8
-continued
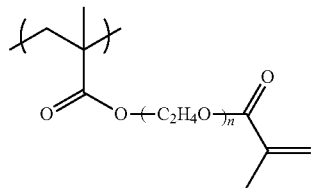
B-29: n = 2
B-30: n = 4.5
B-31: n = 8
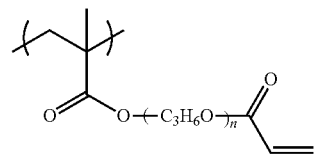
B-32: n = 4~6
B-33: n = 4.5
B-34: n = 8
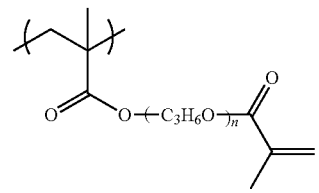
B-35: n = 4~6
B-36: n = 4.5
B-37: n = 8
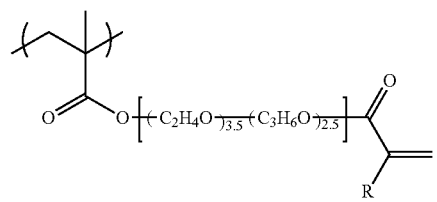
B-38: R = H
B-39: R = $CH_3$
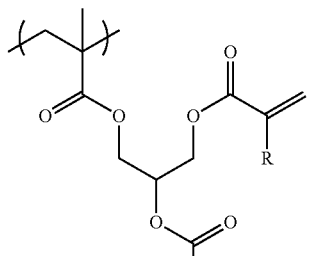
B-40: R = H
B-41: R = $CH_3$
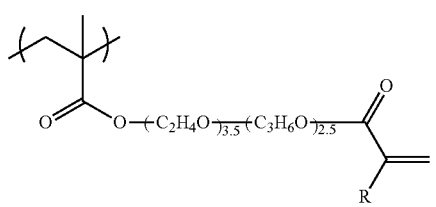
B-42: R = H
B-43: R = $CH_3$

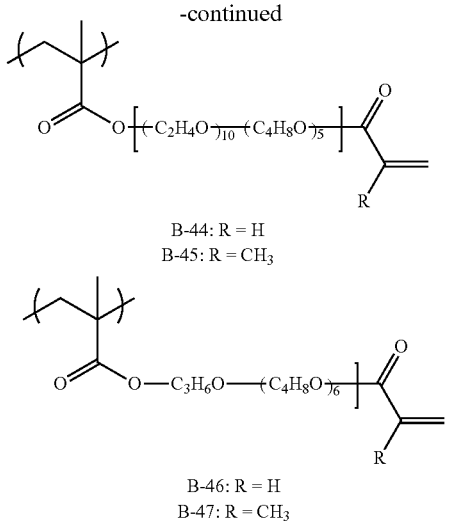

B-44: R = H
B-45: R = CH₃

B-46: R = H
B-47: R = CH₃

In the photo-alignment copolymer, a content a of the repeating unit A described above and a content b of the repeating unit B described above satisfy preferably Expression (12), more preferably Expression (13), still more preferably Expression (14), and particularly preferably Expression (15) in terms of the mass ratio.

$$0.03 \le a/(a+b) \le 0.5 \quad (12)$$

$$0.03 \le a/(a+b) \le 0.3 \quad (13)$$

$$0.03 \le a/(a+b) \le 0.2 \quad (14)$$

$$0.05 \le a/(a+b) \le 0.2 \quad (15)$$

Further, in a case where the photo-alignment copolymer has the repeating unit B1 described above and the repeating unit B2 described above, from the viewpoint of further increasing the strength of the optically anisotropic layer including the photo-alignment layer while maintaining satisfactory liquid crystal aligning properties and adhesiveness, the content a of the repeating unit A described above, a content b1 of the repeating unit B1 described above, and a content b2 of the repeating unit B2 described above satisfy preferably Expression (16), more preferably Expression (17), and still more preferably Expression (18) in terms of the mass ratio.

$$0.05 \le b2/(a+b1+b2) \le 0.7 \quad (16)$$

$$0.10 \le b2/(a+b1+b2) \le 0.5 \quad (17)$$

$$0.12 \le b2/(a+b1+b2) \le 0.35 \quad (18)$$

The photo-alignment copolymer may have repeating units other than the repeating unit A and the repeating unit B described above as long as the effects of the present invention are not impaired.

Examples of the monomer (radically polymerizable monomer) forming such repeating units include an acrylic acid ester compound, a methacrylic acid ester compound, a maleimide compound, an acrylamide compound, acrylonitrile, a maleic acid anhydride, a styrene compound, and a vinyl compound.

A method of synthesizing the photo-alignment copolymer is not particularly limited, and for example, the photo-alignment copolymer can be synthesized by mixing a monomer forming the repeating unit A described above, a monomer forming the repeating unit B described above, and monomer forming any other repeating units and polymerizing the mixture in an organic solvent using a radically polymerization initiator.

From the viewpoint of further improving the liquid crystal aligning properties, the weight-average molecular weight (Mw) of the photo-alignment copolymer is preferably in a range of 10000 to 500000 and more preferably in a range of 30000 to 300000.

In a case where the photo-alignment copolymer is used, the content of the photo-alignment copolymer in the composition for forming a photo-alignment layer is not particularly limited, but in a case where the composition contains an organic solvent, the content thereof is preferably in a range of 0.1 to 50 parts by mass and more preferably in a range of 0.5 to 10 parts by mass with respect to 100 parts by mass of the organic solvent.

(Additive)

The composition for forming a photo-alignment layer may contain one or more additives other than the photoactive compound. For example, the additive is added for the purpose of adjusting the refractive index of the composition for forming a photo-alignment layer. As the additive, a compound containing a hydrophilic group and a (meth) acryloyloxy group is preferable from the viewpoint of the compatibility with the photoactive compound, and the additive can be added to the extent that the alignment ability is not significantly reduced. Examples of the hydrophilic group include a hydroxyl group, a carboxyl group, a sulfo group, and an amino group.

As another example, the additive is added for the purpose of adjusting the elastic modulus of the photo-alignment layer. Examples of the additive include a crosslinking agent, a filler, and a plasticizer. From the viewpoint that the alignment ability is not reduced, it is preferable that a crosslinking agent is used and that the crosslinkable group of the crosslinking agent can react with the crosslinkable group of the photoactive compound. Further, it is also preferable that one molecule of the crosslinking agent contains a plurality of crosslinkable groups.

(Crosslinking Agent)

Examples of the crosslinking agent include a compound containing two or more epoxy groups or oxetanyl groups in a molecule, a blocked isocyanate compound (compound containing a protected isocyanate group), and an alkoxymethyl group-containing compound.

Among these, a compound containing two or more epoxy groups or oxetanyl groups in a molecule or a blocked isocyanate compound described in the specific examples below is preferable.

(1) Compound Containing Two or More Epoxy Groups in Molecule

Specific examples of the compound containing two or more epoxy groups in a molecule include an aliphatic epoxy compound.

Such compounds are available as commercially available products. Examples of the commercially available products include DENACOL EX-611, EX-612, EX-614, EX-614B, EX-622, EX-512, EX-521, EX-411, EX-421, EX-313, EX-314, EX-321, EX-211, EX-212, EX-810, EX-811, EX-850, EX-851, EX-821, EX-830, EX-832, EX-841, EX-911, EX-941, EX-920, EX-931, EX-212L, EX-214L, EX-216L, EX-321L, EX-850L, DLC-201, DLC-203, DLC-204, DLC-205, DLC-206, DLC-301, and DLC-402 (all manufactured by Nagase ChemteX Corporation), CELLOXIDE 2021P, 2081, 3000, EHPE3150, EPOLEAD GT401, CELVENUS B0134, and B0177 (all manufactured by Daicel Corporation), IPU-22G (manufactured by Okamura Oil Mill, Ltd.), and jERYX7105, jERYX7110, jERYX7400, and jERYX7180BH40 (all manufactured by Mitsubishi Chemical Corporation).

Such products can be used alone or in combination of two or more kinds thereof.

(2) Compound Containing Two or More Oxetanyl Groups in Molecule

Specific examples of the compound containing two or more oxetanyl groups in a molecule include ARON OXETANE OXT-121, OXT-221, OX-SQ, and PNOX (all manufactured by Toagosei Co., Ltd.).

(3) Blocked Isocyanate Compound

The blocked isocyanate compound is not particularly limited as long as the compound contains a blocked isocyanate group in which the isocyanate group is chemically protected, but a compound containing two or more blocked isocyanate groups in one molecule is preferable from the viewpoint of the curing properties.

The blocked isocyanate group in the present invention is a group capable of generating an isocyanate group by heat, and preferred examples thereof include a group in which a blocking agent and an isocyanate group are allowed to react with each other to protect the isocyanate group. Further, it is preferable that the blocked isocyanate group is a group capable of generating an isocyanate group by heat having a temperature of 90° C. to 250° C.

Further, the skeleton of the blocked isocyanate compound is not particularly limited, and any blocked isocyanate compound may be used as long as the compound contains two isocyanate groups in one molecule, and an aliphatic, alicyclic, or aromatic polyisocyanate may be used, and suitable examples thereof include isocyanate compounds such as 2,4-tolylene diisocyanate, 2,6-tolylene diisocyanate, isophorone diisocyanate, 1,6-hexamethylene diisocyanate, 1,3-trimethylene diisocyanate, 1,4-tetramethylene diisocyanate, 2,2,4-trimethylhexamethylene diisocyanate, 2,4,4-trimethylhexamethylene diisocyanate, 1,9-nonamethylene diisocyanate, 1,10-decamethylene diisocyanate, 1,4-cyclohexane diisocyanate, 2,2'-diethylether diisocyanate, diphenylmethane-4,4'-diisocyanate, o-xylene diisocyanate, m-xylene diisocyanate, p-xylene diisocyanate, methylene bis (cyclohexyl isocyanate), cyclohexane-1,3-dimethylene diisocyanate, cyclohexane-1,4-dimethylene diisocyanate, 1,5-naphthalene diisocyanate, p-phenylene diisocyanate, 3,3'-methylene ditolylene-4,4'-diisocyanate, 4,4'-diphenyl ether diisocyanate, tetrachlorophenylene diisocyanate, norbornane diisocyanate, hydrogenated 1,3-xylylene diisocyanate, and hydrogenated 1,4-xylylene diisocyanate, and compounds having prepolymer-type skeletons derived from these compounds. Among these, tolylene diisocyanate (TDI), diphenylmethane diisocyanate (MDI), hexamethylene diisocyanate (HDI), or isophorone diisocyanate (IPDI) is particularly preferable.

Examples of the mother structure of the blocked isocyanate compound include a biuret type structure, an isocyanurate type structure, an adduct type structure, and a bifunctional prepolymer type structure.

Examples of the blocking agent forming the block structure of the blocked isocyanate compound include an oxime compound, a lactam compound, a phenol compound, an alcohol compound, an amine compound, an active methylene compound, a pyrazole compound, a mercaptan compound, an imidazole-based compound, and an imide-based compound. Among these, a blocking agent selected from an oxime compound, a lactam compound, a phenol compound, an alcohol compound, an amine compound, an active methylene compound, and a pyrazole compound is particularly preferable.

A commercially available product can be used as the blocked isocyanate compound, and preferred examples thereof CORONATE AP STABLE M, CORONATE 2503, 2515, 2507, 2513, 2555, and MILLIONATE MS-50 (all manufactured by Nippon Polyurethane Industry Co., Ltd.), TAKENATE B-830, B-815N, B-820NSU, B-842N, B-846N, B-870N, B-874N, and B-882N (all manufactured by Mitsui Chemicals, Inc.), DURANATE 17B-60PX, 17B-60P, TPA-B80X, TPA-B80E, MF-B60X, MF-B60B, MF-K60X, MF-K60B, E402-B80B, SBN-70D, SBB-70P, and K6000 (all manufactured by Asahi Kasei Chemicals Corporation), DESMODUR BL1100, BL1265 MPA/X, BL3575/1, BL3272MPA, BL3370MPA, BL3475BA/SN, BL5375MPA, VPLS2078/2, BL4265SN, PL340, PL350, and SUMIDUR BL3175 (all manufactured by Sumika Bayer Urethane Co., Ltd.).

(4) Content

In a case where the composition for forming a photo-alignment layer contains a crosslinking agent, the content thereof is not particularly limited, but is preferably in a range of 1 to 300 parts by mass and more preferably in a range of 10 to 100 parts by mass with respect to 100 parts by mass of the photoactive compound described above, from the viewpoint that the effects of the present invention are more excellent.

The composition for forming a photo-alignment layer may contain components other than the above-described components, and examples thereof include a crosslinking catalyst (such as a thermally reactive acid generator), an adhesion improver, a leveling agent, and a surfactant.

In a case where the additive is used for the purpose of adjusting the refractive index of the composition for forming a photo-alignment layer, the refractive index of the additive is preferably in a range of 1.4 to 1.6 and more preferably in a range of 1.4 to 1.55.

(Organic Solvent)

From the viewpoint of the workability for preparing a photo-alignment layer, it is preferable that the composition for forming a photo-alignment layer contains an organic solvent.

Specific examples of the organic solvent include ketones (such as acetone, 2-butanone, methyl isobutyl ketone, cyclohexanone, and cyclopentanone), ethers (such as dioxane and tetrahydrofuran), aliphatic hydrocarbons (such as hexane), alicyclic hydrocarbons (such as cyclohexane), aromatic hydrocarbons (such as toluene, xylene, and trimethylbenzene), carbon halides (such as dichloromethane, dichloroethane, dichlorobenzene, and chlorotoluene), esters (such as methyl acetate, ethyl acetate, and butyl acetate), water, alcohols (such as ethanol, isopropanol, butanol, and cyclohexanol), cellosolves (such as methylcellosolve and ethyl cellosolve), cellosolve acetates, sulfoxides (such as dimethylsulfoxide), and amides (such as dimethylformamide and dimethylacetamide), and such solvents may be used alone or in combination of two or more kinds thereof.

In the present invention, from the viewpoint of enhancing the adhesiveness between the photo-alignment layer and the light absorption anisotropic layer, it is preferable that the composition for forming a photo-alignment layer is a composition containing a compound (such as the photo-alignment copolymer described above) that contains a photoreactive group and a crosslinkable group and containing no radical polymerization initiator.

(Coating Method)

As a method of coating the above-described polymer film with the composition for forming a photo-alignment layer, known methods, for example, a coating method such as a spin coating method, an extrusion method, a gravure coating method, a die coating method, a bar coating method, or an applicator method and a printing method such as a flexographic method are employed.

In a case where the optical laminate is produced by a Roll-to-Roll type continuous production method, a printing method such as a gravure coating method, a die coating method, or a flexographic method is typically employed as the coating method.

<Drying Step>

A method of heating the coating film formed by the coating step so that the coating film is dried is not particularly limited, and the drying temperature is preferably in a range of 50° C. to 180° C. and more preferably in a range of 80° C. to 150° C.

The drying time is preferably in a range of 10 seconds to 10 minutes and more preferably in a range of 30 seconds to 5 minutes.

In a case where the composition for forming a photo-alignment layer contains a compound containing a cross-linking catalyst such as a thermally reactive acid generator and a cationically polymerizable crosslinkable group, it is preferable that curing of the coating film is promoted by the crosslinking reaction by being heated.

<Light Irradiation Step>

The polarized light to be applied to the coating film after the drying step is not particularly limited, and examples thereof include linearly polarized light, circularly polarized light, and elliptically polarized light. Among these, linearly polarized light is preferable.

Further, "oblique direction" in which non-polarized light is applied is not particularly limited as long as the direction is inclined at a polar angle θ (0<θ<90°) with respect to the normal direction of the surface of the coating film, and the polar angle θ can be appropriately selected depending on the purpose thereof, but is preferably in a range of 20° to 80°.

In the present specification, "irradiation with linearly polarized light" and "irradiation with non-polarized light" are operations for causing a photoreaction in the photoactive compound. The wavelength of the light to be used varies depending on the photoactive compound to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

Examples of the light source used for irradiation with light include commonly used light sources, for example, lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic coloring agent polarizing plate, or a wire grid polarizing plate), a method of using a prism-based element (for example, a Glan-Thompson prism) or a reflective type polarizer for which a Brewster's angle is used, or a method of using light emitted from a laser light source having polarized light can be employed. In addition, only light having a required wavelength may be selectively applied using a filter or a wavelength conversion element.

In a case where light to be applied is linearly polarized light, a method of applying light vertically or obliquely to the upper surface with respect to the alignment layer or the surface of the alignment layer from the rear surface is employed. The incidence angle of light varies depending on the photoactive compound, but is preferably in a range of 0° to 90° (vertical) and preferably in a range of 40° to 90°.

In a case where light to be applied is non-polarized light, the alignment layer is irradiated with non-polarized light obliquely. The incidence angle thereof is preferably in a range of 10° to 80°, more preferably in a range of 20° to 60°, and still more preferably in a range of 30° to 50°.

The irradiation time is preferably in a range of 1 minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

It is preferable that the photo-alignment layer used in the present invention is an alignment layer having an average refractive index of 1.55 or greater and 1.8 or less at a wavelength of 550 nm. From the viewpoint of further improving the antireflection performance, the average refractive index at a wavelength of 550 nm is more preferably in a range of 1.55 to 1.7 in order to reduce a difference in the refractive index between the photo-alignment layer and the light absorption anisotropic layer.

Further, in the photo-alignment layer used in the present invention, the in-plane refractive index anisotropy Δn at a wavelength of 550 nm is preferably 0.05 or greater and 0.45 or less. The in-plane refractive index anisotropy Δn at a wavelength of 550 nm is more preferably 0.1 or greater and 0.4 or less and still more preferably 0.1 or greater and 0.3 or less.

By appropriately controlling the refractive index anisotropy of the photo-alignment layer, the antireflection function can be further improved.

<Rubbing Treatment Alignment Layer>

A rubbing treatment alignment layer is a layer to which an alignment regulation force is applied by a rubbing treatment.

A polymer material used for the rubbing treatment alignment layer is described in a plurality of documents, and a plurality of commercially available products can be used. In the present invention, polyvinyl alcohol or polyimide and derivatives thereof are preferably used. As the alignment layer, the description on page 43, line 24 to page 49, line 8 of WO2001/88574A1 can be referred to.

[Thickness of Resin Layer]

From the viewpoint that the effects of the present invention are more excellent, the thickness d of the resin layer is preferably 10 µm or less, more preferably 5 µm or less, still more preferably 3 µm or less, and particularly preferably 2 µm or less.

Further, the thickness d of the resin layer is preferably 0.01 µm or greater and more preferably 0.1 µm or greater.

[Storage Elastic Modulus Ea of Resin Layer]

The storage elastic modulus Ea of the resin layer is not particularly limited as long as the storage elastic modulus Ea satisfies Formula (1-1), but is preferably 1 GPa or greater and 10 GPa or less and more preferably 1 GPa or greater and 5 GPa or less from the viewpoint that the effects of the present invention are more excellent.

A method of controlling the storage elastic modulus Ea of the resin layer is not particularly limited, and examples thereof include a method of changing the kind of the compound forming the resin layer, a method of blending a crosslinking agent into the composition for forming the resin layer, and a method of changing the conditions in a case of irradiation with light.

[Light Absorption Anisotropic Layer]

The light absorption anisotropic layer of the specific laminate is a layer containing a dichroic substance and having light absorption anisotropy.

From the viewpoint of further increasing absorption anisotropy, it is preferable that the light absorption anisotropic layer is a light absorption anisotropic layer formed by being coated with a liquid crystal composition containing a dichroic substance and a polymer liquid crystal compound. Suitable examples of the light absorption anisotropic layer according to such an aspect include the polarizing layer described in paragraphs [0079] to [0215] of WO2020/179864A.

[Thickness of Light Absorption Anisotropic Layer]

The thickness of the light absorption anisotropic layer is preferably 5 µm or less, more preferably 0.1 to 5.0 µm, and still more preferably 0.3 to 2.0 µm.

[Cured Layer]

The specific laminate may include a cured layer having a thickness of 100 nm or less for the purpose of reducing a difference in refractive index between the light absorption anisotropic layer and the adjacent layer. It is preferable that the specific laminate include the cured layer on the side of the light absorption anisotropic layer opposite to the side of the resin layer (particularly, the photo-alignment layer).

Such a cured layer is not particularly limited, and various known layers can be used. Examples of such a cured layer include a layer containing a liquid crystal compound and a layer obtained by curing a composition containing a polyfunctional monomer. It is preferable that the cured layer has a refractive index that enables index matching with the light absorption anisotropic layer.

[Oxygen Blocking Layer]

The specific laminate may include an oxygen blocking layer for the purpose of improving light resistance. It is preferable that the specific laminate include an oxygen blocking layer on the side of the light absorption anisotropic layer opposite to the side of the resin layer (particularly, the photo-alignment layer).

Here, the oxygen blocking layer is an oxygen blocking film with an oxygen blocking function, and specific examples thereof include layers containing organic compounds such as polyvinyl alcohol, polyethylene vinyl alcohol, polyvinyl ether, polyvinylpyrrolidone, polyacrylamide, polyacrylic acid, cellulose ether, polyamide, polyimide, a styrene/maleic acid copolymer, gelatin, vinylidene chloride, and cellulose nanofibers.

In the present specification, the oxygen blocking function is not limited to a function for making a state where oxygen is not allowed to pass at all, and also includes a function for making a state where a small amount of oxygen is allowed to pass depending on the desired performance.

In a case where an oxygen blocking layer is provided on a transparent polymer film and a photo-alignment layer containing an azobenzene compound represented by Formula (I) is provided on the oxygen blocking layer, from the viewpoint of enhancing the aligning properties, it is preferable that polyvinyl alcohol having a saponification degree of 95% by mole or greater or modified polyvinyl alcohol having a saponification degree of 95% by mole or greater is used as the oxygen blocking layer.

Further, examples of the oxygen blocking layer also include a thin layer consisting of a metal compound (metal compound thin layer). As a method of forming the metal compound thin layer, any method can be used as long as a desired thin layer can be formed. Suitable examples thereof include a sputtering method, a vacuum deposition method, an ion plating method, and a plasma chemical vapor deposition (CVD) method. Specifically, the forming methods described in JP3400324B, JP2002-322561A, and JP2002-361774A can be employed.

The component contained in the metal compound thin layer is not particularly limited as long as the component can exhibit an oxygen blocking function, and an oxide, a nitride, an oxynitride, or the like containing one or more metals selected from Si, Al, In, Sn, Zn, Ti, Cu, Ce, Ta and the like can be used. Among these, an oxide, a nitride, or an oxynitride of a metal selected from Si, Al, In, Sn, Zn, and Ti is preferable, and a metal oxide, a nitride, or an oxynitride selected from Si, Al, Sn, and Ti is particularly preferable. These may contain other elements as secondary components.

Further, the oxygen blocking layer may be in the form of lamination of the layer containing an organic material and the metal compound thin layer as described in, for example, U.S. Pat. No. 6,413,645B, JP2015-226995A, JP2013-202971A, JP2003-335880A, JP1978-12953A (JP-S53-12953A), and JP1983-217344A (JP-S58-217344A) and may be a layer obtained by hybridizing an organic compound and an inorganic compound as described in WO2011/11836A, JP2013-248832A, and JP3855004B.

In a case where the optical laminate according to the embodiment of the present invention is a phase difference film which has a λ/4 plate described below and in which the λ/4 plate is provided with an optically anisotropic layer having a λ/4 function on a support, the oxygen blocking layer may also serve as an alignment layer of an optically anisotropic layer having a λ/4 function. In such a case, an oxygen blocking layer containing polyvinyl alcohol, polyamide, or polyimide is preferable.

[Thickness of Oxygen Blocking Layer]

The thickness of the oxygen blocking layer is not particularly limited, but in a case where the layer contains an organic compound, the thickness of the oxygen blocking layer is preferably in a range of 0.1 to 10 µm and more preferably in a range of 0.5 to 5.5 µm from the viewpoint that the effects of the present invention are more excellent. In a case of the metal compound thin layer, the thickness of the oxygen blocking layer is preferably in a range of 5 nm to 500 nm and more preferably in a range of 10 nm to 200 nm from the viewpoint that the effects of the present invention are more excellent.

The specific laminate may include an optically anisotropic layer (retardation layer) other than the light absorption anisotropic layer. For example, the specific laminate may include an optically anisotropic layer on the surface of the light absorption anisotropic layer opposite to the photo-alignment layer on the side opposite to the photo-alignment layer. It is more preferable that the specific laminate includes at least one light absorption anisotropic layer and at least one retardation layer and still more preferable that the specific laminate consists of a light absorption anisotropic layer and a λ/4 plate.

[Thickness of Specific Laminate]

From the viewpoint that the effects of the present invention are more excellent, the thickness of the specific laminate is preferably in a range of 0.1 µm to 10 µm and more preferably in a range of 1 µm to 5 µm.

[3] Surface Protective Layer

The laminate according to the embodiment of the present invention may include a surface protective layer on the most viewing side. The surface protective layer is not limited as long as the layer has a function of protecting the surface. The surface protective layer may be formed of one layer and preferably a plurality of layers. It is preferable that the surface protective layer has a high hardness and also preferable that the surface protective layer has an excellent recovery property. A low-reflection layer that suppresses surface reflection that occurs at the air interface is also preferable.

The configuration of the transparent support and the surface coating layer is assumed as one of the preferred embodiments. Hereinafter, the transparent support and the surface coating layer will be described.

[Transparent Support]

The laminate according to the embodiment of the present invention may include a transparent support.

Here, the term "transparent" in the present invention indicates that the transmittance of visible light is 60% or greater, preferably 80% or greater, and particularly preferably 90% or greater.

Specific examples of the transparent support include a glass substrate and a plastic substrate. Among these, a plastic substrate is preferable.

Examples of the plastic constituting the plastic substrate include a polyolefin such as polyethylene, polypropylene, or a norbornene-based polymer, a cyclic olefin-based resin, polyvinyl alcohol, polyethylene terephthalate, polymethacrylic acid ester, polyacrylic acid ester, cellulose ester such as triacetyl cellulose (TAC), diacetyl cellulose, or cellulose acetate propionate, polyethylene naphthalate, polycarbonate, polysulfone, polyether sulfone, polyether ketone, polyphenylene sulfide, polyphenylene oxide, and polyimide. Among these, from the viewpoints of availability from the market and excellent transparency, cellulose ester, a cyclic olefin-based resin, polyethylene terephthalate, or polymethacrylic acid ester is particularly preferable. From the viewpoint of flexibility, polyimide is excellent. Polyimide has a high refractive index and thus may have a large refractive index gap, but it is also preferable that the refractive index is adjusted by a method of mixing silica particles or the like. The details of the polyimide are described in WO2018/062296A and WO2018/062190A.

It is preferable that the thickness of the transparent support is set to be small to the extent that the strength and the workability can be maintained from the viewpoint that the mass thereof enables the support to be practically handled and sufficient transparency can be ensured.

The thickness of the glass substrate is preferably 100 to 3000 μm and preferably 100 to 1000 μm.

The thickness of the plastic substrate is preferably in a range of 5 to 300 μm and more preferably in a range of 5 to 200 μm.

Further, in a case where the laminate according to the embodiment of the present invention is used as a circularly polarizing plate (particularly in a case where the laminate is used as a circularly polarizing plate for mobile devices), the thickness of the transparent support is preferably in a range of 5 to 100 μm.

[Surface Coating Layer]

Examples of the surface coating layer includes at least one selected from the group consisting of an antireflection layer, an antiglare layer, and a hard coat layer. Known layer materials are used for the antireflection layer, the antiglare layer, and the hard coat layer. In addition, these layers may be formed by laminating a plurality of layers.

The antireflection layer indicates a structure that is different from an antireflection plate of a so-called circularly polarizing plate and that reduces reflection by a structure using light interference. The antireflection layer may have a configuration consisting of only a low refractive index layer as the simplest configuration. In order to further reduce the reflectivity, it is preferable that an antireflection layer is formed by combining a high refractive index layer having a high refractive index and a low refractive index layer having a low refractive index. Examples of the configuration thereof include a configuration in which two layers of a high refractive index layer and a low refractive index layer are laminated in order from the lower side and a configuration in which three layers with different refractive indices are laminated in order of a medium refractive index layer (layer with a higher refractive index than that of the lower layer), a high refractive index layer, and a low refractive index layer, and a configuration in which a plurality of antireflection layers are laminated has been suggested. Among these, from the viewpoints of the durability, the optical characteristics, the cost, and the productivity, a configuration in which a medium refractive index layer, a high refractive index layer, and a low refractive index layer are sequentially laminated on a hard coat layer is preferable, and examples thereof include the configurations described in JP1996-122504A (JP-H8-122504A), JP1996-110401A (JP-H8-110401A), JP1998-300902A (JP-H10-300902A), JP2002-243906A, JP2000-111706A, and the like. Further, an antireflection film having a three-layer configuration with excellent robustness with respect to fluctuations in film thickness is described in JP2008-262187A. In a case where the antireflection film having the above-described three-layer configuration is provided on the surface of an image display device, the average value of the reflectivity can be set to 0.5% or less, the reflected glare can be significantly reduced, and an image with an excellent stereoscopic effect can be obtained. In addition, other functions may be imparted to each layer, and examples thereof include an antifouling low refractive index layer, an antistatic high refractive index layer, an antistatic hard coat layer, and an antiglare hard coat layer (the layers described in JP1998-206603A (JP-H10-206603A), JP2002-243906A, JP2007-264113A, and the like).

As one embodiment of the present invention, as the foldable organic EL display device, the description of JP2018-56069A can be referred to except for the polarizer. A surface film is required because cover glass cannot be used. For example, paragraphs [0030] to [0040] describe that a polyimide-based resin is preferable as a base material having a curvature radius of 3 mm or less (for example, 3 mm, 2 mm, or 1 mm) and bending properties such that the base material can be bent preferably 200000 times, more preferably 300000 times, and still more preferably 500000 times and that an organic-inorganic hybrid material obtained by mixing silica particles and a cage-like silsesquioxane compound with an ultraviolet-curable acrylic resin is preferable as a hard coat layer.

As the surface layer of the present invention, a hard coat obtained by using a silsesquioxane compound having a structure described in JP2015-212353A, JP2017-008148A, and the like is preferable.

[4] λ/4 Plate

The optical laminate according to the embodiment of the present invention may include a λ/4 plate on a side of the pressure sensitive adhesive layer 1 opposite to the specific laminate.

Here, "λ/4 plate" is a plate having a λ/4 function, specifically, a plate having a function of converting linearly polarized light having a specific wavelength into circularly polarized light (or converting circularly polarized light into linearly polarized light).

Specific examples of the λ/4 plate include those described in US2015/0277006A.

For example, specific examples of a form in which the λ/4 plate has a monolayer structure include a stretched polymer film and a phase difference film in which an optically anisotropic layer having a λ/4 function is provided on a support. Further, specific examples of a form in which the λ/4 plate has a multilayer structure include a broadband λ/4 plate obtained by laminating a λ/4 plate and a λ/2 plate.

It is more preferable that the phase difference film provided with the optically anisotropic layer having a λ/4 function is a phase difference film formed of one or more layers containing at least one liquid crystal compound (such as a disk-like liquid crystal compound or a rod-like liquid crystal compound) formed by polymerizing a liquid crystal monomer exhibiting a nematic liquid crystal layer or a smectic liquid crystal layer.

Further, it is still more preferable to use a liquid crystal compound having reciprocal wavelength dispersibility as the λ/4 plate having excellent optical performance. Specifically, the liquid crystal compound represented by Formula (II) described in WO2017/043438A is preferably used. In regard to a method of preparing the λ/4 plate formed of a liquid crystal compound having reciprocal wavelength dispersibility, the description of Examples 1 to 10 of WO2017/043438A and Example 1 of JP2016-91022A can be referred to.

[5] Functional Layer

It is preferable that the laminate according to the embodiment of the present invention or the above-described specific laminate includes a functional layer having a function of reducing short wave light on a viewing side with respect to the light absorption anisotropic layer. By reducing short wave light, an optical laminate that suppresses photodecomposition of a coloring agent compound and has excellent light resistance can be provided.

As an aspect, it is preferable that the above-described pressure sensitive adhesive layer or oxygen blocking layer has a function of reducing short wave light.

As another aspect, it is also preferable that a layer having a function of reducing short wave light is newly provided on the viewing side with respect to the optically anisotropic layer (particularly, the light absorption anisotropic layer).

A method of reducing short wave light is not particularly limited, and examples thereof include a method of applying light absorption using an absorbing agent or the like and a method of applying wavelength selective reflection using a multilayer film.

The above-described short wave light is light having a wavelength of 430 nm or less. By reducing the light having a wavelength of 430 nm or less, photodecomposition of a coloring agent compound due to sunlight or light from a light source used in the light resistance test of JIS B 7751 and JIS B 7754 can be suppressed.

Further, it is preferable to be transparent in a wavelength range of 450 nm or greater so as not to affect the performance of the polarizer in visible light.

[6] Applications

The optical laminate according to the embodiment of the present invention can be used, for example, as a polarizer (polarizing plate) and specifically, for example, as a linearly polarizing plate or a circularly polarizing plate (particularly for antireflection).

[II] Image Display Device

An image display device according to the embodiment of the present invention includes the above-described optical laminate according to the embodiment of the present invention.

The display element used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and an organic EL display panel is more preferable. That is, in the image display device according to the embodiment of the present invention, a liquid crystal display device obtained by using a liquid crystal cell as a display element or an organic EL display device obtained by using an organic EL display panel as a display element is preferable, and an organic EL display device is more preferable.

[1] Liquid Crystal Display Device

A liquid crystal display device which is an example of the image display device according to the embodiment of the present invention is a liquid crystal display device that includes the above-described optical laminate according to the embodiment of the present invention (but does not include a λ/4 plate) and a liquid crystal cell.

In the present invention, between the optical laminates provided on both sides of the liquid crystal cell, it is preferable that the optical laminate according to the embodiment of the present invention is used as a front-side (viewing side) polarizer and more preferable that the optical laminate according to the embodiment of the present invention is used as a front-side polarizer and a rear-side polarizer.

Hereinafter, the liquid crystal cell constituting the liquid crystal display device will be described in detail.

[Liquid Crystal Cell]

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystal molecules (rod-like liquid crystal compound) are substantially horizontally aligned in a case of no voltage application and further twistedly aligned at 60° to 120°. The liquid crystal cell in a TN mode is most frequently used as a color TFT liquid crystal display device and is described in a plurality of documents.

In the liquid crystal cell in a VA mode, rod-like liquid crystal molecules are substantially vertically aligned at the time of no voltage application. The concept of the liquid crystal cell in a VA mode includes (1) liquid crystal cell in a VA mode in a narrow sense where rod-like liquid crystal molecules are aligned substantially vertically in a case of no voltage application and substantially horizontally in a case of voltage application (described in JP1990-176625A (JP-H2-176625A)), (2) liquid crystal cell (in a multi-domain vertical alignment (MVA) mode) (SID97, described in Digest of tech. Papers (proceedings) 28 (1997) 845) in which the VA mode is formed to have multi-domain in order to expand the viewing angle, (3) liquid crystal cell in an axially symmetric aligned microcell (n-ASM) mode in which rod-like liquid crystal molecules are substantially vertically aligned in a case of no voltage application and twistedly multi-domain aligned in a case of voltage application (described in proceedings of Japanese Liquid Crystal Conference, pp. 58 to 59 (1998)), and (4) liquid crystal cell in a SURVIVAL mode (presented at LCD International 98). Further, the liquid crystal cell may be of any of a patterned vertical alignment (PVA) type, a photo-alignment (optical alignment) type, or a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

[2] Organic EL Display Device

As an organic EL display device which is an example of the image display device according to the embodiment of the present invention, an embodiment of a display device including the above-described optical laminate (here, including a pressure sensitive adhesive layer and a λ/4 plate) according to the embodiment of the present invention and an organic EL display panel in order from the viewing side is suitably exemplified.

Further, the organic EL display panel is a display panel formed using an organic EL element having an organic light-emitting layer (organic electroluminescence layer) interposed between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

Example 1

[Preparation of Transparent Support]
<Preparation of Core Layer Cellulose Acylate Dope>

The following composition was put into a mixing tank and stirred to dissolve each component, thereby preparing a cellulose acetate solution used as a core layer cellulose acylate dope.

Core Layer Cellulose Acylate Dope
  Cellulose acetate having acetyl substitution degree of 2.88: 100 parts by mass
  Polyester compound B described in example of JP2015-227955A: 12 parts by mass
  Compound F shown below: 2 parts by mass
  Methylene chloride (first solvent): 430 parts by mass
  Methanol (second solvent): 64 parts by mass

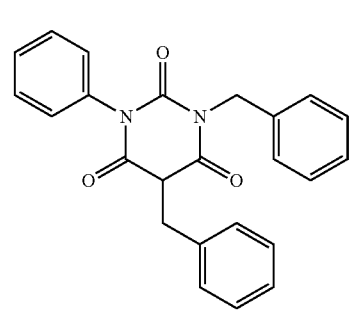

Compound F

<Preparation of Outer Layer Cellulose Acylate Dope>

10 parts by mass of the following matting agent solution was added to 90 parts by mass of the above-described core layer cellulose acylate dope, thereby preparing a cellulose acetate solution used as an outer layer cellulose acylate dope.

Matting Agent Solution
  Silica particles with average particle size of 20 nm (AEROSIL R972, manufactured by Nippon Aerosil Co., Ltd.): 2 parts by mass
  Methylene chloride (first solvent): 76 parts by mass
  Methanol (second solvent): 11 parts by mass
  Core layer cellulose acylate dope described above: 1 parts by mass <Preparation of Cellulose Acylate Film 1>

The core layer cellulose acylate dope and the outer layer cellulose acylate dope were filtered through filter paper having an average pore size of 34 µm and a sintered metal filter having an average pore size of 10 µm, and three layers which were the core layer cellulose acylate dope and the outer layer cellulose acylate dopes provided on both sides of the core layer cellulose acylate dope were simultaneously cast from a casting port onto a drum at 20° C. (band casting machine).

Next, the film was peeled off in a state where the solvent content was approximately 20% by mass, both ends of the film in the width direction were fixed by tenter clips, and the film was dried while being stretched at a stretching ratio of 1.1 times in the lateral direction.

Thereafter, the film was further dried by being transported between the rolls of the heat treatment device to prepare an optical film (transparent support) having a thickness of 40 µm, and the optical film was used as a cellulose acylate film 1.

[Formation of Resin Layer A1]

The cellulose acylate film 1 was continuously coated with a coating solution A1 for forming a resin layer described below using a wire bar. The support on which the coating film was formed was dried with hot air at 140° C. for 120 seconds to form a resin layer A1, thereby obtaining a triacetyl cellulose (TAC) film with a resin layer. The film thickness of the resin layer A1 was 2.5 µm. The storage elastic modulus Ea of the resin layer A1 was 4.2 GPa. Further, the moist heat strain δa of the resin layer A1 was 0.48%.

Coating Solution A1 for Forming Resin Layer
  Photo-alignment film polymer PA-1 shown below: 69.20 parts by mass
  Acid generator SAN-AID SI-B3A shown below: 10.38 parts by mass
  Stabilizer DIPEA shown below: 0.42 parts by mass
  Xylene: 828.00 parts by mass
  Methyl isobutyl ketone: 92.00 parts by mass Photo-alignment film polymer PA-1 (In the formulae, the numerical value described in each repeating unit represents the content (% by mass) of each repeating unit with respect to all repeating units)

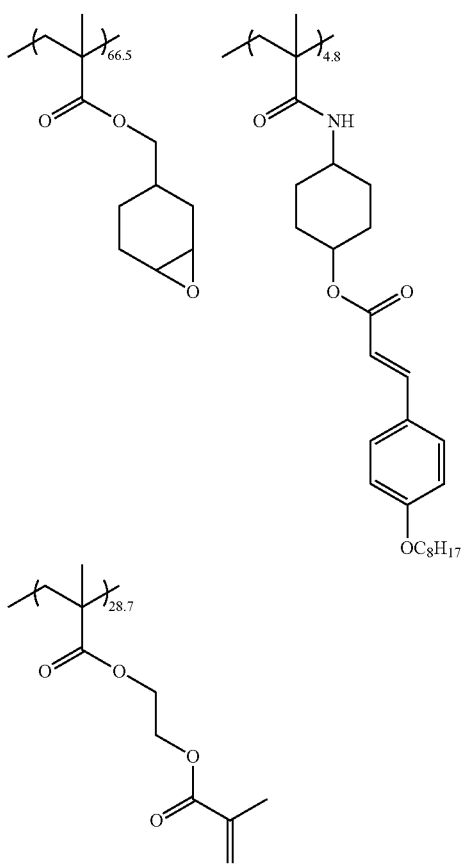

Acid Generator SAN-AID SI-B3A

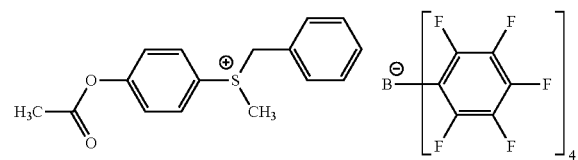

Stabilizer DIPEA

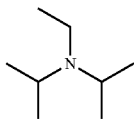

[Preparation of Light Absorption Anisotropic Film P1]

The obtained resin layer A1 was irradiated with polarized ultraviolet rays (10 mJ/cm$^2$, using an ultra-high pressure mercury lamp) to exhibit the photo-alignment ability and was continuously coated with a composition P1 for forming a light absorption anisotropic film having the following composition using a wire bar, thereby forming a coating layer P1.

Next, the coating layer P1 was heated at 140° C. for 15 seconds, and the coating layer P1 was cooled to room temperature (23° C.).

Next, the coating layer P1 was heated at 75° C. for 60 seconds and cooled to room temperature again.

Thereafter, the coating layer was irradiated with an LED lamp (center wavelength of 365 nm) for 2 seconds under an irradiation condition of an illuminance of 200 mW/cm$^2$, thereby preparing a light absorption anisotropic film P1 on the resin layer A1. The film thickness of the light absorption anisotropic film P1 was 0.5 km.

Composition P1 for Forming Light Absorption Anisotropic Film
  First dichroic substance C-1 shown below: 0.59 parts by mass
  Second dichroic substance M-1 shown below: 0.36 parts by mass
  Third dichroic substance Y-1 shown below: 0.24 parts by mass
  Liquid crystal compound L-1 shown below: 5.55 parts by mass
  Polymerization initiator IRGACURE OXE-02 (manufactured by BASF SE): 0.21 parts by mass
  Surfactant F-1 shown below: 0.055 parts by mass
  Cyclopentanone: 45.34 parts by mass
  Tetrahydrofuran: 45.34 parts by mass
  Benzyl alcohol: 2.33 parts by mass Dichroic Substance C-1 (Maximal Absorption Wavelength: 570 nm)

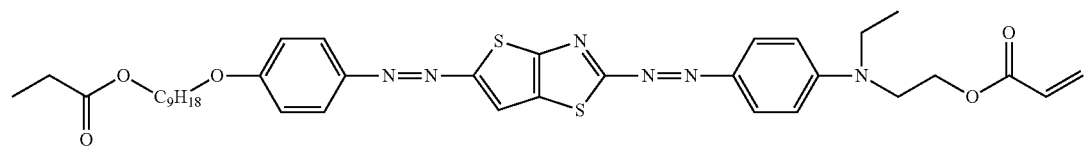

Dichroic Substance M-1 (Maximal Absorption Wavelength: 466 nm)

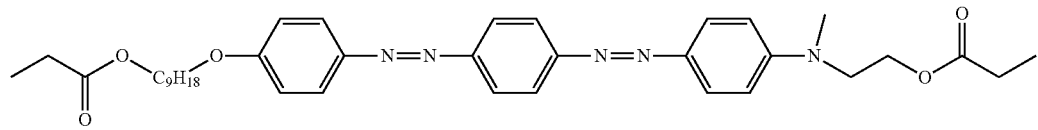

Dichroic Substance Y-1 (Maximal Absorption Wavelength: 417 nm)

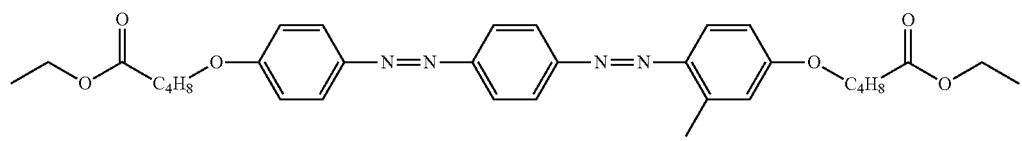

Liquid crystal compound L-1 (in the formulae, the numerical values ("59", "15", and "26") described in each repeating unit represent the content (% by mass) of each repeating unit with respect to all repeating units)

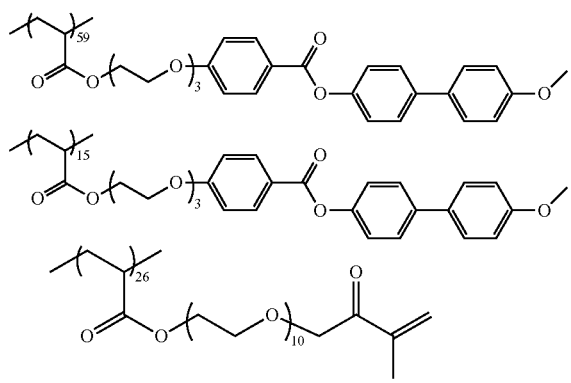

Surfactant F-1 (in the formulae, the numerical values described in each repeating unit represent the content (% by mass) of each repeating unit with respect to all repeating units)

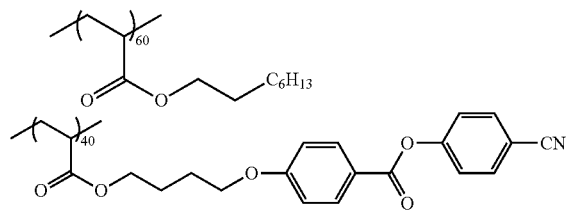

[Formation of Oxygen Blocking Layer B1]

The light absorption anisotropic film P1 was continuously coated with a coating solution B1 having the following composition with a wire bar. Thereafter, the film was dried with hot air at 80° C. for 5 minutes, thereby obtaining a laminate A on which the oxygen blocking layer B1 consisting of polyvinyl alcohol (PVA) having a thickness of 1.0 μm was formed, that is, a laminate A in which the cellulose acylate film 1 (transparent support), the resin layer A1, the light absorption anisotropic film P1, and the oxygen blocking layer B1 were provided adjacent to each other in this order. Further, the transmittance of the obtained laminate A in a wavelength range of 280 to 780 nm was measured with a spectrophotometer, and the visible light average transmittance was 48%.

Coating Solution B1 for Forming Oxygen Blocking Layer

Modified polyvinyl alcohol shown below: 3.80 parts by mass

Initiator Irg2959: 0.20 parts by mass

Water: 70 parts by mass

Methanol: 30 parts by mass

Modified Polyvinyl Alcohol

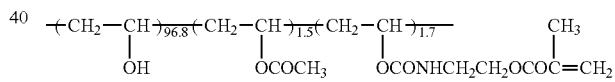

[Preparation of TAC Film A1 Including Positive A-Plate A1]

The cellulose acylate film 1 was continuously coated with a coating solution PA1 for forming a photo-alignment film having the following composition using a wire bar. The support on which the coating film was formed was dried with hot air at 140° C. for 120 seconds, and the coating film was irradiated with polarized ultraviolet rays (10 mJ/cm$^2$, using an ultra-high pressure mercury lamp) to form a photo-alignment film PA1 having a thickness of 0.2 m, thereby obtaining a TAC film with a photo-alignment film.

Coating Solution PA1 for Forming Photo-Alignment Film

Photo-alignment film polymer PA-2 shown below: 100.00 parts by mass

Acid generator PAG-1 shown below: 5.00 parts by mass

Acid generator CPI-110TF shown below: 0.005 parts by mass

Isopropyl alcohol: 16.50 parts by mass

Butyl acetate: 1072.00 parts by mass

Methyl ethyl ketone: 268.00 parts by mass

Photo-Alignment Film Polymer PA-2

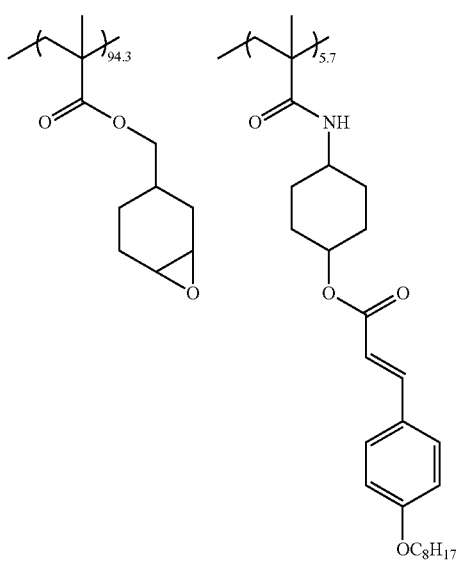

Acid Generator PAG-1

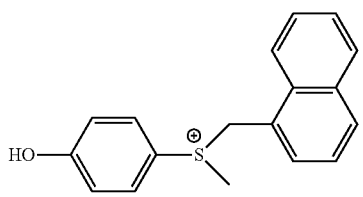

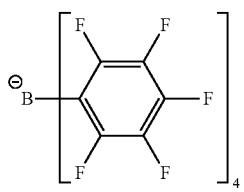

Acid Generator CPI-110F

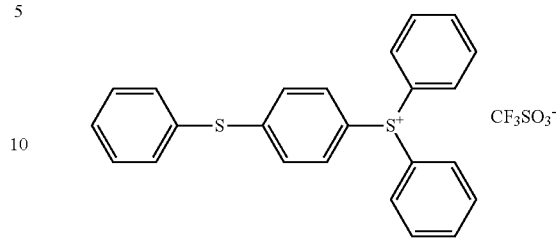

The photo-alignment film PA1 was coated with the composition A-1 having the following composition using a bar coater. The coating film formed on the photo-alignment film PA1 was heated to 120° C. with hot air, cooled to 60° C., irradiated with ultraviolet rays having a wavelength of 365 nm with an illuminance of 100 mJ/cm² using a high-pressure mercury lamp in a nitrogen atmosphere, and continuously irradiated with ultraviolet rays with an illuminance of 500 mJ/cm² while being heated at 120° C. so that the alignment of the liquid crystal compound was fixed, thereby preparing a TAC film A1 having a positive A-plate A1.

The thickness of the positive A-plate A1 was 2.5 m, and the Re (550) was 144 nm. Further, the positive A-plate A1 satisfied the relationship of "Re (450)≤Re (550)≤Re (650)". Re (450)/Re (550) was 0.82.

Composition A-1
  Polymerizable liquid crystal compound LA-1 shown below: 43.50 parts by mass
  Polymerizable liquid crystal compound LA-2 shown below: 43.50 parts by mass
  Polymerizable liquid crystal compound LA-3 shown below: 8.00 parts by mass
  Polymerizable liquid crystal compound LA-4 shown below: 5.00 parts by mass
  Polymerization initiator PI-1 shown below: 0.55 parts by mass
  Leveling agent T-1: 0.20 parts by mass
  Cyclopentanone: 235.00 parts by mass Polymerizable Liquid Crystal Compound LA-1 (tBu Represents Tertiary Butyl Group)

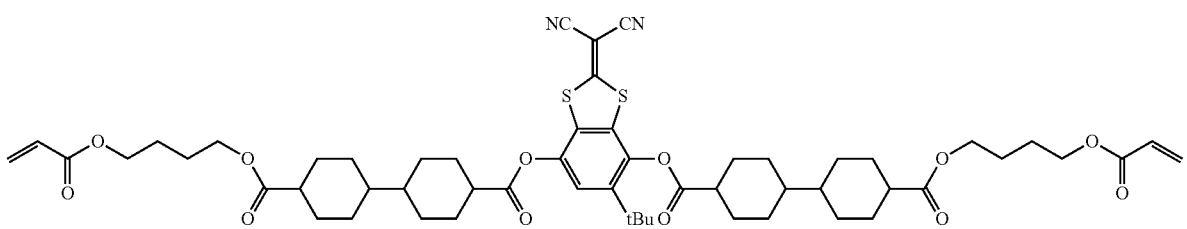 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]

Polymerizable Liquid Crystal Compound LA-2

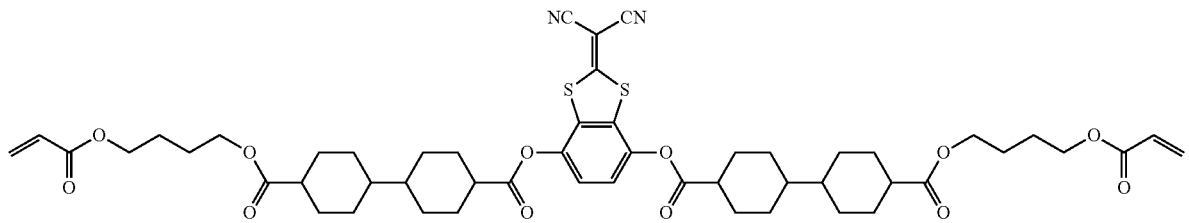 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]

Polymerizable Liquid Crystal Compound LA-3

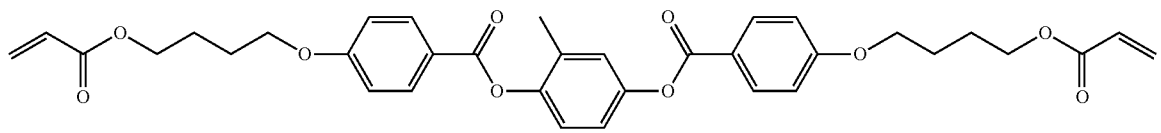 [SMILES: C=CC(=O)OCCCCOc1ccc(C(=O)Oc2ccc(OC(=O)c3ccc(OCCCCOC(=O)C=C)cc3)c(C)c2)cc1]

Polymerizable Liquid Crystal Compound LA-4 (Me Represents Methyl Group)

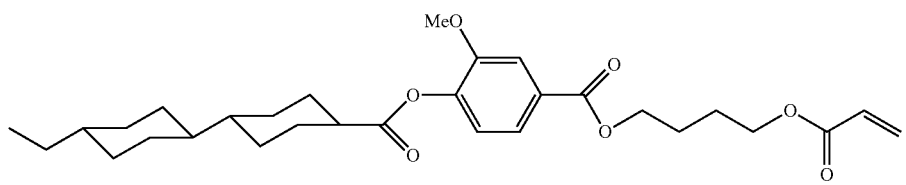 [SMILES: C=CC(=O)OCCCCOC(=O)c1ccc(OC(=O)C2CCC(C3CCC(CC)CC3)CC2)c(OC)c1]

Polymerization Initiator PI-1

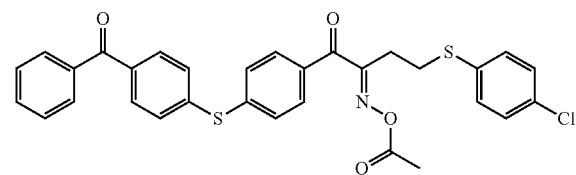 [SMILES: CC(=O)O/N=C(\CCSc1ccc(Cl)cc1)C(=O)c1ccc(Sc2ccc(C(=O)c3ccccc3)cc2)cc1]

Leveling Agent T-1

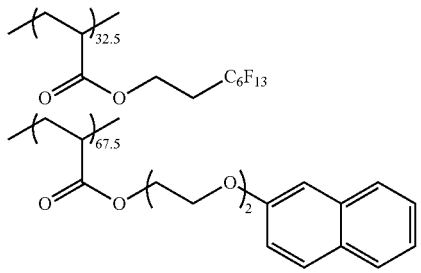

[Preparation of TAC Film C1 Having Positive C-Plate C1]

The above-described cellulose acylate film 1 was used as a temporary support.

The cellulose acylate film 1 was allowed to pass through a dielectric heating roll at a temperature of 60° C., the film surface temperature was increased to 40° C., one surface of the film was coated with an alkaline solution having the following composition such that the coating amount reached 14 ml/m² using a bar coater and heated to 110° C., and the film was transported for 10 seconds under a steam-type far-infrared heater (manufactured by Noritake Co., Ltd.).

Next, the film was coated with pure water such that the coating amount reached 3 ml/m² using the same bar coater.

Next, the process of washing the film with water using a fountain coater and draining the film using an air knife was repeated three times, and the film was transported to a drying zone at 70° C. for 10 seconds and dried, thereby preparing a cellulose acylate film 1 which had been subjected to an alkali saponification treatment.

(Alkaline Solution)
Potassium hydroxide: 4.7 parts by mass
Water: 15.8 parts by mass
Isopropanol: 63.7 parts by mass
Surfactant SF-1 ($C_{14}H_{29}O(CH_2CH_2O)_{20}H$): 1.0 parts by mass
Propylene glycol: 14.8 parts by mass The cellulose acylate film 1 that had been subjected to the alkali saponification treatment was continuously coated with a coating solution PA2 for forming an alignment film having the following composition using a #8 wire bar. The obtained film was dried with hot air at 60° C. for 60 seconds and further dried with hot air at 100° C. for 120 seconds, thereby forming an alignment film PA2.

Coating Solution PA2 for Forming Alignment Film
Polyvinyl alcohol (PVA103, manufactured by Kuraray Co., Ltd.): 2.4 parts by mass
Isopropyl alcohol: 1.6 parts by mass
Methanol: 36 parts by mass
Water: 60 parts by mass The alignment film PA2 was coated with a coating solution C1 for forming a positive C-plate having the following composition, the obtained coating film was aged at 60° C. for 60 seconds and irradiated with ultraviolet rays with an illuminance of 1000 mJ/cm² in the air using an air-cooled metal halide lamp at an illuminance of 70 mW/cm² (manufactured by Eye Graphics Co., Ltd.), and the alignment state thereof was fixed to vertically align the liquid crystal compound, thereby preparing a TAC film C1 having a positive C-plate C1 with a thickness of 0.5 μm.

The Rth (550) of the obtained positive C-plate was −60 nm.

Coating Solution C1 for Forming Positive C-Plate
- Liquid crystal compound LC-1 shown below: 80 parts by mass
- Liquid crystal compound LC-2 shown below: 20 parts by mass
- Vertically aligned liquid crystal compound S01: 1 part by mass
- Ethylene oxide-modified trimethylolpropane triacrylate (V #360, manufactured by Osaka Organic Chemical Industry Ltd.): 8 parts by mass
- IRGACURE 907 (manufactured by BASF SE): 3 parts by mass
- KAYACURE DETX (manufactured by Nippon Kayaku Co., Ltd.): 1 part by mass
- Compound B03 shown below: 0.4 parts by mass
- Methyl ethyl ketone: 170 parts by mass
- Cyclohexanone: 30 parts by mass Liquid Crystal Compound LC-1

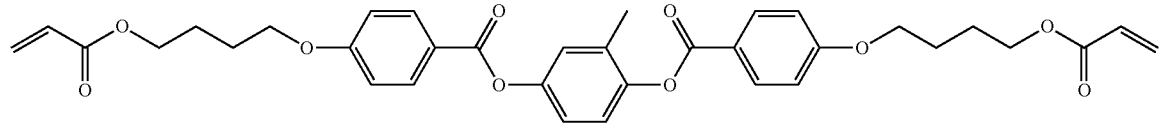 [SMILES: C=CC(=O)OCCCCOc1ccc(C(=O)Oc2ccc(OC(=O)c3ccc(OCCCCOC(=O)C=C)cc3)c(C)c2)cc1]

Liquid Crystal Compound LC-2

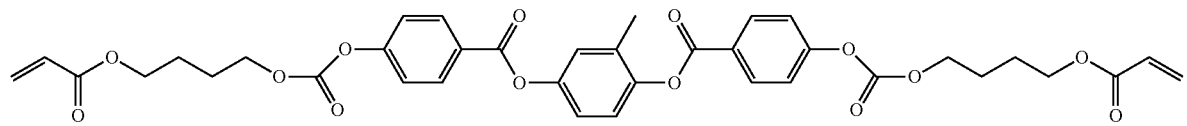 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

Vertically Aligned Liquid Crystal Compound S01

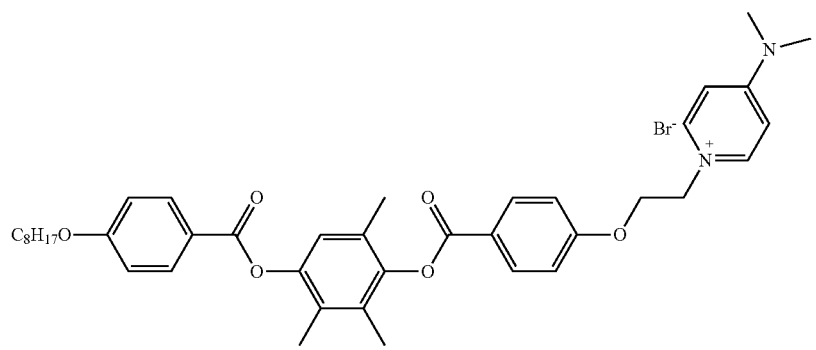

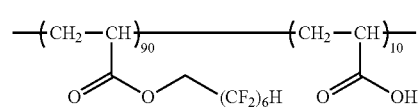

[Preparation of UV Adhesive Composition]

The following UV adhesive composition was prepared.

UV Adhesive Composition
- CEL2021P (manufactured by Daicel Corporation) shown below: 70 parts by mass
- 1,4-Butanediol diglycidyl ether: 20 parts by mass
- 2-Ethylhexyl glycidyl ether: 10 parts by mass
- CPI-100P: 2.25 parts by mass

CPI-100P

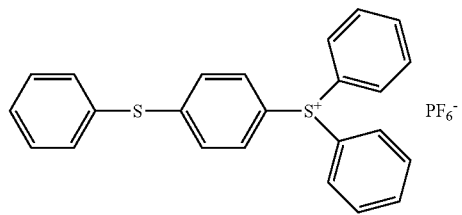

[Preparation of Optical Laminate of Example 1]

The TAC film A1 having the positive A-plate A1 on the phase difference side (positive A-plate A1 side) and the TAC film C1 having the positive C-plate C1 on the phase difference side (positive C-plate C1 side) were bonded to each other by irradiation with UV rays having a light dose of 600 mJ/cm$^2$ using the UV adhesive composition. The thickness of the UV adhesive layer was 3 μm. Further, the surfaces bonded to each other with the UV adhesive were respectively subjected to a corona treatment. Next, the photo-alignment layer PA1 on the positive A-plate A1 side and the cellulose acylate film 1 were removed to obtain a phase difference plate 1. Further, the layer configuration of the phase difference plate 1 is formed of the positive A-plate A1, the UV adhesive layer, the positive C-plate C1, an alignment layer PA2, and the cellulose acylate film 1.

Next, the laminate A on the oxygen blocking layer B1 side was bonded to a low-reflection surface film CV-LC5 (manufactured by FUJIFILM Corporation) on a support side using Opteria D692 (thickness: 15 m, storage elastic modulus: 0.004 GPa, manufactured by Lintec Corporation) as a pressure sensitive adhesive A. Next, only the cellulose acylate film 1 was removed, and the removed surface and the phase difference plate 1 on the positive A-plate A1 side were bonded to each other using the pressure sensitive adhesive A, thereby preparing an optical laminate of Example 1. Here, the bonding was made such that the angle between the absorption axis of the light absorption anisotropic layer P1 and the slow axis of the positive A-plate A1 reached 45°.

In this manner, an optical laminate of Example 1 including the cellulose acylate film 1, the alignment layer PA2, the positive C-plate C1, the UV adhesive layer, the positive A-plate A1 (λ/4 plate), the pressure sensitive adhesive A, the resin layer A1, the light absorption anisotropic layer P1, the oxygen blocking layer B1, the pressure sensitive adhesive A, and the low-reflection surface film CV-LC5 (surface protective layer) adjacent to each other in this order was obtained.

Examples 2 to 4

Each optical laminate was prepared by the same method as in Example 1 except that the coating solution A1 for forming a resin layer was changed to a coating solution A2 for forming a resin layer having the following composition and the film thickness of the resin layer was changed to the film thickness as listed in Table 1.

Coating Solution A2 for Forming Resin Layer
  Photo-alignment film polymer PA-1 shown above: 51.53 parts by mass
  jER YX7400 (manufactured by Mitsubishi Chemical Corporation): 7.73 parts by mass
  EPOLEAD GT401 (manufactured by Daicel Corporation): 13.40 parts by mass
  Acid generator SAN-AID SI-B3A shown above: 6.90 parts by mass
  Stabilizer DIPEA shown above: 0.44 parts by mass
  Xylene: 828.00 parts by mass
  Methyl isobutyl ketone: 92.00 parts by mass Example 5

An optical laminate was prepared by the same method as in Example 1 except that the coating solution A1 for forming a resin layer was changed to a coating solution A3 for forming a resin layer having the following composition and the film thickness of the resin layer was changed to the film thickness as listed in Table 1.

Coating Solution A3 for Forming Resin Layer
  Photo-alignment film polymer PA-1 shown above: 49.08 parts by mass
  jER YX7400 (manufactured by Mitsubishi Chemical Corporation): 7.36 parts by mass
  EPOLEAD GT401 (manufactured by Daicel Corporation): 12.76 parts by mass
  Acid generator SAN-AID SI-B3A shown above: 10.38 parts by mass
  Stabilizer DIPEA shown above: 0.42 parts by mass
  Xylene: 828.00 parts by mass
  Methyl isobutyl ketone: 92.00 parts by mass Example 6

An optical laminate was prepared by the same method as in Example 1 except that the coating solution A1 for forming a resin layer was changed to a coating solution A4 for forming a resin layer having the following composition and the film thickness of the resin layer was changed to the film thickness as listed in Table 1.

Coating Solution A4 for Forming Resin Layer
  Photo-alignment film polymer PA-1 shown above: 51.53 parts by mass
  jER YX7400 (manufactured by Mitsubishi Chemical Corporation): 21.13 parts by mass
  Acid generator SAN-AID SI-B3A shown above: 6.90 parts by mass
  Stabilizer DIPEA shown above: 0.44 parts by mass
  Xylene: 828.00 parts by mass
  Methyl isobutyl ketone: 92.00 parts by mass Example 7

An optical laminate was prepared by the same method as in Example 1 except that the coating solution A1 for forming a resin layer was changed to a coating solution A5 for forming a resin layer having the following composition and the surface of the laminate A from which the cellulose acylate film 1 had been removed and the phase difference plate 1 on the positive A-plate A1 side were bonded to each other using the following pressure sensitive adhesive B.

Coating Solution A5 for Forming Resin Layer
  Photo-alignment film polymer PA-1 shown above: 36.33 parts by mass
  jER YX7400 (manufactured by Mitsubishi Chemical Corporation): 36.33 parts by mass
  Acid generator SAN-AID SI-B3A shown above: 6.90 parts by mass
  Stabilizer DIPEA shown above: 0.44 parts by mass
  Xylene: 828.00 parts by mass
  Methyl isobutyl ketone: 92.00 parts by mass

[Preparation of Pressure Sensitive Adhesive B]

Next, an acrylic polymer was prepared according to the following procedures.

70 parts by mass of 2-ethylhexyl acrylate, 20 parts by mass of ethyl acrylate, 6 parts by mass of hydroxyethyl methacrylate, and 4 parts by mass of acrylic acid were polymerized by a solution polymerization method in a reaction container equipped with a cooling pipe, a nitrogen introduction pipe, a thermometer, and a stirrer, thereby obtaining an acrylic polymer 1 with an average molecular weight of 300000.

Next, the pressure sensitive adhesive B was prepared using the obtained acrylic polymer 1 according to the following procedures.

Specifically, 3.83 parts by mass of trimethylolpropane tolylene diisocyanate (CORONATE L, manufactured by Nippon Polyurethane Industry Co., Ltd.) was added to 100 parts by mass of the solid content of the acrylic polymer 1, thereby preparing a pressure sensitive adhesive composition B.

Next, a PET film subjected to a surface treatment with a silicone-based release agent was coated with the prepared pressure sensitive adhesive composition B using a die coater and dried at 150° C. for 3 hours, thereby preparing a pressure sensitive adhesive B having a pressure sensitive adhesive layer with a thickness of 15 µm. The storage elastic modulus of the pressure sensitive adhesive B was 0.001 GPa.

Example 8

An optical laminate was prepared by the same method as in Example 1 except that the coating solution A1 for forming a resin layer was changed to a coating solution A6 for forming a resin layer having the following composition and the surface of the laminate A from which the cellulose acylate film 1 had been removed and the phase difference plate 1 on the positive A-plate A1 side were bonded to each other using PD-Si (thickness: 25 µm, storage elastic modulus: 0.0005 GPa, manufactured by Panac Co., Ltd.) as a pressure sensitive adhesive C.

Coating Solution A6 for Forming Resin Layer
  Photo-alignment film polymer PA-1 shown above: 31.46 parts by mass
  jER YX7400 (manufactured by Mitsubishi Chemical Corporation): 37.75 parts by mass
  Acid generator SAN-AID SI-B3A shown above: 10.38 parts by mass
  Stabilizer DIPEA shown above: 0.42 parts by mass
  Xylene: 828.00 parts by mass
  Methyl isobutyl ketone: 92.00 parts by mass Example 9

An optical laminate was prepared by the same method as in Example 1 except that the coating solution A1 for forming a resin layer was changed to a coating solution A7 for forming a resin layer having the following composition and the film thickness of the resin layer was changed to the film thickness as listed in Table 1.

Coating Solution A7 for Forming Resin Layer
  Photo-alignment film polymer PA-1 shown above: 51.53 parts by mass Example 10

A laminate B in which the cellulose acylate film 1 (transparent support), the resin layer B1, the light absorption anisotropic film P1, and the oxygen blocking layer B1 were provided adjacent to each other in this order was obtained by the same method as in Example 1 except that the coating solution A1 for forming a resin layer was changed to a coating solution B1 for forming a resin layer having the following composition.

Coating Solution B1 for Forming Resin Layer
  Photo-alignment film polymer PA-3 shown below: 73.50 parts by mass
  Acid generator SAN-AID SI-B3A shown above: 6.06 parts by mass
  Stabilizer DIPEA shown above: 0.44 parts by mass
  Butyl acetate: 736.00 parts by mass
  Methyl ethyl ketone: 184.00 parts by mass Next, a TAC film A1 having a positive A-plate A1, a TAC film C1 having a positive C-plate C1, and a phase difference plate 1 were prepared by the same method as in Example 1.

Next, in the preparation of an optical laminate by the same method as in Example 1, the laminate B on the oxygen blocking layer B1 side was bonded to the low-reflection surface film CV-LC5 (manufactured by FUJIFILM Corporation) on the support side using Opteria D692 (thickness: 15 m, storage elastic modulus: 0.004 GPa, manufactured by Lintec Corporation) as the pressure sensitive adhesive A, both the cellulose acylate film 1 of the laminate B and the resin layer B1 were removed, the surface after the removal was continuously coated with the following coating solution A8 for forming a resin layer using a wire bar, dried with hot air at 60° C. for 1 minute, and irradiated with an LED lamp (center wavelength of 365 nm) for 2 seconds under an irradiation condition of an illuminance of 200 mW/cm², thereby forming a resin layer A8 with a thickness of 0.4 µm.

Coating Solution A8 for Forming Resin Layer
  ACRIT 8KX-078 (manufactured by Taisei Fine Chemical Co., Ltd., solid content of 40%): 23.34 parts by mass
  Polymerization initiator IRGACURE OXE-02 (manufactured by BASF SE): 0.28 parts by mass
  Surfactant F-5 shown below: 0.009 parts by mass
  Methyl ethyl ketone: 76.37 parts by mass

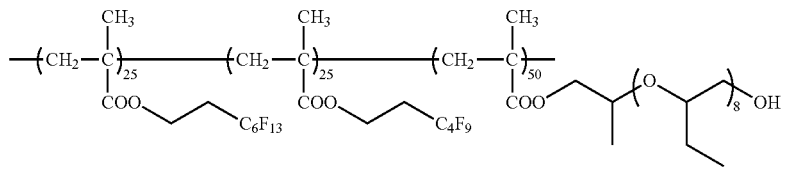

IPU-22G (manufactured by Okamura Oil Mill, Ltd.): 7.73 parts by mass
EPOLEAD GT401 (manufactured by Daicel Corporation): 13.40 parts by mass
Acid generator SAN-AID SI-B3A shown above: 6.90 parts by mass
Stabilizer DIPEA shown above: 0.44 parts by mass
Xylene: 828.00 parts by mass
Methyl isobutyl ketone: 92.00 parts by mass Next, the resin layer A8 and the phase difference plate 1 on the positive A-plate A1 side were bonded to each other by the same method as in Example 1, thereby preparing an optical laminate of Example 10.

In this manner, an optical laminate in which the cellulose acylate film 1, the alignment layer PA2, the positive C-plate C1, the UV adhesive layer, the positive A-plate A1 (λ/4 plate), the pressure sensitive adhesive A, the resin layer A8, the light absorption anisotropic layer P1, the oxygen blocking layer B1, the pressure sensitive adhesive A, and the low-reflection surface film CV-LC5 (surface protective layer) were provided adjacent to each other in this order was prepared.

Comparative Example 1

An optical laminate was prepared by the same method as in Example 1 except that the coating solution A1 for forming a resin layer was changed to the composition PA1 for forming an alignment layer used in Example 7 of WO2020/080359A and the film thickness of the resin layer (photo-alignment layer) was changed to 0.5 μm as in Example 7.

Comparative Examples 2 and 3

An optical laminate was prepared by the same method as in Example 1 except that the composition of the coating solution for forming a resin layer and the kind of the pressure sensitive adhesive were changed as listed in Table 1.

[Evaluation of Durability]

The durability of each of the obtained optical laminates was evaluated.

Specifically, the optical laminate was cut into 10 cm square, and the cellulose acylate film 1 and the alignment layer PA2 were removed to expose the positive C-plate C1. Specifically, the exposed surface of the positive C-plate C1 and an aluminum substrate were bonded to each other using the pressure sensitive adhesive C, allowed to stand in a thermohygrostat at 60° C. and 90% RH for 65 hours, and taken out, and the surface state was visually observed and evaluated according to the following evaluation standards. Further, the surface reflectance of the prepared aluminum substrate was 84%.

AA: Reflection unevenness was not found after the aluminum substrate was put in the thermohygrostat.

A: Reflection unevenness was slightly found after the aluminum substrate was put in the thermohygrostat.

B: Reflection unevenness was slightly found after the aluminum plate was put in the thermohygrostat.

C: Reflection unevenness was significantly found after the aluminum plate was put in the thermohygrostat.

The results are listed in Table 1. Practically, AA to B preferable, and AA is more preferable as the evaluation result.

TABLE 1

| | Resin layer | | Pressure sensitive adhesive layer 1 Type of pressure sensitive adhesive | Storage elastic modulus Ep of pressure sensitive adhesive layer 1 [GPA] | Storage elastic modulus Ea of resin layer [GPa] | Moist heat strain δa [%] | $1/4(3 \times Ep/Ea)^{2/3}$ | $1/4(3 \times Ep/Ea)^{2/3} - \delta a$ | Dura-bility |
|---|---|---|---|---|---|---|---|---|---|
| | Composition | Thickness [μm] | | | | | | | |
| Example 1 | A1 | 2.5 | Pressure sensitive adhesive A | 0.004 | 4.2 | 0.48 | 0.50 | 0.02 | B |
| Example 2 | A2 | 2.5 | Pressure sensitive adhesive A | 0.004 | 3.9 | 0.46 | 0.53 | 0.07 | B |
| Example 3 | A2 | 1.5 | Pressure sensitive adhesive A | 0.004 | 3.9 | 0.46 | 0.53 | 0.07 | A |
| Example 4 | A2 | 0.5 | Pressure sensitive adhesive A | 0.004 | 3.9 | 0.46 | 0.53 | 0.07 | 4 |
| Example 5 | A3 | 0.5 | Pressure sensitive adhesive A | 0.004 | 4.2 | 0.35 | 0.50 | 0.15 | AA |
| Example 6 | A4 | 0.5 | Pressure sensitive adhesive A | 0.004 | 3.7 | 0.27 | 0.55 | 0.28 | AA |
| Example 7 | A5 | 0.5 | Pressure sensitive adhesive B | 0.001 | 2.9 | 0.14 | 0.26 | 0.12 | B |
| Example 8 | A6 | 0.5 | Pressure sensitive adhesive C | 0.0005 | 2.7 | 0.12 | 0.17 | 0.05 | B |
| Example 9 | A7 | 0.5 | Pressure sensitive adhesive A | 0.004 | 3.8 | 0.50 | 0.54 | 0.04 | B |
| Example 10 | A8 | 0.5 | Pressure sensitive adhesive A | 0.004 | 3.0 | 0.25 | 0.63 | 0.38 | AA |
| Comparative example 1 | *1 | 0.5 | Pressure sensitive adhesive A | 0.004 | 4.3 | 0.65 | 0.50 | — | C |
| Comparative example 2 | A1 | 2.5 | Pressure sensitive adhesive B | 0.001 | 4.2 | 0.48 | 0.20 | — | C |
| Comparative example 3 | A2 | 2.5 | Pressure sensitive adhesive B | 0.001 | 3.9 | 0.46 | 0.21 | — | C |

*1: Composition PA1 for forming alignment layer used in Example 7 of WO2020/080359A As shown in the results listed in Table 1, it was found that all the optical laminates in which the storage elastic modulus Ep of the pressure sensitive adhesive layer 1 and the storage elastic modulus Ea and the moist heat strain δa of the resin layer satisfied Expression (1-1) had satisfactory durability (Examples 1 to 10). In particular, it was found that the optical laminate satisfying Expression (1-4) had more satisfactory durability.

$$1/4(3 \times Ep/Ea)^{2/3} > \delta a \qquad (1\text{-}1)$$

$$1/4(3 \times Ep/Ea)^{2/3} - \delta a \geq 0.15 \qquad (1\text{-}4)$$

On the contrary, it was found that in the optical laminate having the resin layer (photo-alignment layer) described in WO2020/080359A, the storage elastic modulus Ep of the pressure sensitive adhesive layer 1 and the storage elastic modulus Ea and the moist heat strain δa of the resin layer did not satisfy Expression (1-1), and thus the durability was poor (Comparative Example 1).

Further, it was found that even in a case where the optical laminate had the same resin layer as in Example 1, the durability was poor in a case where the kind of pressure sensitive adhesives was different from that of Example 1 and Expression (1-1) was not satisfied (Comparative Examples 2 and 3).

EXPLANATION OF REFERENCES

1: pressure-sensitive adhesive layer
2: pressure-sensitive adhesive layer
20: resin layer
22: photo-alignment layer
30: light absorption anisotropic layer
40: specific laminate
42: specific laminate
50: cured layer
60: oxygen blocking layer
70: surface protective layer
80: λ/4 plate
100: optical laminate
200: optical laminate

What is claimed is:

1. An optical laminate comprising in the following order:
a pressure sensitive adhesive layer 1;
a specific laminate including a resin layer and a light absorption anisotropic layer which are adjacent to each other; and
a pressure sensitive adhesive layer 2,
wherein the light absorption anisotropic layer contains a dichroic substance,
the pressure sensitive adhesive layer 1 is adjacent to the resin layer included in the specific laminate, and
a storage elastic modulus Ep of the pressure sensitive adhesive layer 1 and a storage elastic modulus Ea and a moist heat strain δa of the resin layer satisfy Expression (1-1), $$\tfrac{1}{4}(3 \times Ep/Ea)^{2/3} > \delta a \quad (1\text{-}1)$$

where both the storage elastic modulus Ep of the pressure sensitive adhesive layer 1 and the storage elastic modulus Ea of the resin layer are in units of GPa, and the moist heat strain δa of the resin layer denotes a value defined by Equation (2), $$\delta a = L_{max}/L_0 \times 100 \quad (2)$$

$L_{max}$: a maximum displacement amount (mm) in a case where a temperature profile in the following moist heat strain test is applied
$L_0$: a distance between chucks (mm) in the following moist heat strain test
Moist heat strain test: a single resin layer film having a film thickness of 10 μm is used as a specimen, the specimen is held in an environment of 25° C. and a relative humidity of 50% for 30 minutes in a state where the distance between chucks is set to 15 mm and an extension load of 0.02 mN is applied thereto, the temperature and the humidity of the specimen are increased to 60° C. and a relative humidity of 90% over 80 minutes, the specimen is held in the environment of 60° C. and a relative humidity of 90% for 120 minutes, and the temperature and the humidity are decreased to 25° C. and a relative humidity of 50% over 80 minutes.

2. The optical laminate according to claim 1,
wherein the resin layer is an alignment layer.
3. The optical laminate according to claim 2,
wherein the alignment layer is a photo-alignment layer.
4. The optical laminate according to claim 1,
wherein the storage elastic modulus Ep of the pressure sensitive adhesive layer 1 and the storage elastic modulus Ea and the moist heat strain δa of the resin layer satisfy Expression (1-2), $$\tfrac{1}{4}(3 \times Ep/Ea)^{2/3} - \delta a \geq 0.15 \quad (1\text{-}2).$$

5. The optical laminate according to claim 1,
wherein the storage elastic modulus Ea of the resin layer is 1 GPa or greater and 10 GPa or less.
6. The optical laminate according to claim 1,
wherein the storage elastic modulus Ea of the resin layer is 1 GPa or greater and 5 GPa or less.
7. The optical laminate according to claim 1,
wherein the optical laminate has a thickness of 50 μm or less.
8. The optical laminate according to claim 1,
wherein the resin layer has a thickness of 2 μm or less.
9. An image display device comprising:
the optical laminate according to claim 1; and
an image display element.
10. The image display device according to claim 9,
wherein the image display device is an organic EL display device.
11. The optical laminate according to claim 2,
wherein the storage elastic modulus Ep of the pressure sensitive adhesive layer 1 and the storage elastic modulus Ea and the moist heat strain δa of the resin layer satisfy Expression (1-2), $$\tfrac{1}{4}(3 \times Ep/Ea)^{2/3} - \delta a \geq 0.15 \quad (1\text{-}2).$$

12. The optical laminate according to claim 2,
wherein the storage elastic modulus Ea of the resin layer is 1 GPa or greater and 10 GPa or less.
13. The optical laminate according to claim 2,
wherein the storage elastic modulus Ea of the resin layer is 1 GPa or greater and 5 GPa or less.
14. The optical laminate according to claim 2,
wherein the optical laminate has a thickness of 50 μm or less.
15. The optical laminate according to claim 2,
wherein the resin layer has a thickness of 2 μm or less.
16. An image display device comprising:
the optical laminate according to claim 2; and
an image display element.
17. The image display device according to claim 16,
wherein the image display device is an organic EL display device.
18. The optical laminate according to claim 3,
wherein the storage elastic modulus Ep of the pressure sensitive adhesive layer 1 and the storage elastic modulus Ea and the moist heat strain δa of the resin layer satisfy Expression (1-2), $$\tfrac{1}{4}(3 \times Ep/Ea)^{2/3} - \delta a \geq 0.15 \quad (1\text{-}2).$$

19. The optical laminate according to claim 3,
wherein the storage elastic modulus Ea of the resin layer is 1 GPa or greater and 10 GPa or less.
20. The optical laminate according to claim 3,
wherein the storage elastic modulus Ea of the resin layer is 1 GPa or greater and 5 GPa or less.

* * * * *